United States Patent
Ono

(10) Patent No.: US 6,259,174 B1
(45) Date of Patent: Jul. 10, 2001

(54) POSITIONING APPARATUS, DRIVE UNIT AND EXPOSURE APPARATUS INCORPORATING THE POSITIONING APPARATUS

(75) Inventor: Kazuya Ono, San Carlos, CA (US)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/505,295

(22) Filed: Feb. 16, 2000

Related U.S. Application Data

(63) Continuation of application No. PCT/JP98/03688, filed on Aug. 20, 1998.

(30) Foreign Application Priority Data

Aug. 21, 1997 (JP) .................................................. 9-224704
Aug. 21, 1997 (JP) .................................................. 9-224705
Oct. 9, 1997 (JP) .................................................. 9-277229
Apr. 15, 1998 (JP) ................................................ 10-104524

(51) Int. Cl.$^7$ ............................................................ H02K 41/00
(52) U.S. Cl. ............................................................................ 310/13
(58) Field of Search ........................................ 310/13, 12, 16, 310/90.5; 318/135, 687

(56) References Cited

U.S. PATENT DOCUMENTS

| | | | | |
|---|---|---|---|---|
| 3,904,897 | * | 9/1975 | Shichida et al. | 310/12 |
| 3,906,262 | * | 9/1975 | Shichida et al. | 310/12 |
| 4,636,666 | * | 1/1987 | Meins | 310/13 |
| 4,654,571 | * | 3/1987 | Hinds | 318/687 |
| 4,774,442 | * | 9/1988 | Teramachi | 318/135 |
| 5,196,745 | | 3/1993 | Trumper | 310/12 |
| 5,440,397 | * | 8/1995 | Ono et al. | 356/401 |
| 5,623,853 | * | 4/1997 | Novak et al. | 74/490.09 |
| 5,780,943 | * | 7/1998 | Ono | 310/12 |
| 5,838,079 | * | 11/1998 | Morohashi et al. | 310/12 |
| 5,886,432 | * | 3/1999 | Markle | 310/12 |
| 5,925,956 | * | 7/1999 | Ohzeki | 310/90.5 |
| 5,996,437 | * | 12/1999 | Novak et al. | 74/490.09 |
| 6,040,675 | * | 3/2000 | Ono | 318/649 |

FOREIGN PATENT DOCUMENTS

| | | |
|---|---|---|
| 0 393 994 B1 | 10/1990 | (EP) . |
| 52-54108 | 5/1977 | (JP) . |
| 61-42268 | 2/1986 | (JP) . |
| 63-148855 | 6/1988 | (JP) . |
| 3-230746 | 10/1991 | (JP) . |
| 4-292328 | 10/1992 | (JP) . |
| 4-351979 | 12/1992 | (JP) . |
| 5-22924 | 1/1993 | (JP) . |
| 6-254734 | 9/1994 | (JP) . |
| 7-48028 | 2/1995 | (JP) . |

\* cited by examiner

*Primary Examiner*—Joseph Waks
(74) *Attorney, Agent, or Firm*—Oliff & Berridge PLC

(57) ABSTRACT

A positioning apparatus positions a movable body 6 on which a wafer W (object to be positioned) is mounted, and includes; a magnetism generation body 8 incorporated in the movable body 6, a magnetic member 10, 15A, 15B, 16 formed so as to have the magnetism generation body 8 therebetween, and a drive unit 11 disposed between the magnetism generation body 8 and the magnetic member 10, for driving the magnetism generation body 8, and the movable body 6 is positioned by means of the magnetic member 10 etc. and the drive unit 11. The positioning apparatus can position a movable body (object to be positioned) at a high speed and with high precision, and is suitable for use for example with an exposure apparatus or the like for positioning a wafer at high precision.

36 Claims, 23 Drawing Sheets

POSITIONING APPARATUS, DRIVE UNIT AND EXPOSURE APPARATUS INCORPORATING THE POSITIONING APPARATUS

This is a Continuation of: International Appln. No. PCT/JP98/03688 filed Aug. 20, 1998 which designated the U.S.

TECHNICAL FIELD

The present invention relates to a positioning apparatus for positioning without contact a movable body on which an object to be positioned, for example a semiconductor wafer or the like is mounted, a drive unit, and an exposure apparatus incorporating this positioning apparatus.

BACKGROUND ART

Conventionally, in a photolithography process for producing a semiconductor device, an image sensing device (CCD or the like), a liquid crystal display device, a thin-film magnetic head or the like, a projection exposure apparatus has been used, such as a stepper or the like for transferring a pattern in a reticle serving as a mask onto each shot area on a wafer (or a glass plate or the like) serving as a substrate, via a projection optical system. With such a projection optical system, it is necessary to position the wafer on an exposure position with high precision. Hence, the wafer is held by a wafer holder by means of vacuum attachment or the like, and conventionally this wafer holder has been fixed on a wafer stage which can be positioned with high precision.

On the contrary, to position a wafer with high precision and at a high speed without being affected by the precision of the mechanical guide face or the like, recently a development of a positioning apparatus for positioning a wafer by lifting a flat table on which the wafer is mounted in a non-contact state has been under way. For example, in U.S. Pat. No. 5,196,745, there is proposed a positioning apparatus in which a permanent magnet with the outside being a N-pole and a permanent magnet with the outside being a S-pole are alternately and two-dimensionally disposed on the upper and lower faces of a table on which a wafer is mounted, and a polyphase coil train corresponding to these permanent magnets is arranged on a fixed body side where the table is housed. With this positioning apparatus, by utilizing the fact that the thrust in the horizontal direction occurs in the polyphase coil where the magnetic flux of the permanent magnets is perpendicular to the table, and the thrust in the vertical direction occurs in the polyphase coil where the magnetic flux is horizontal, the table is positioned in a non-contact state in the directions of six degrees of freedom.

With such a conventional non-contact type positioning apparatus, a plurality of permanent magnets in which the polarity is alternately reversed are attached on the upper and lower faces of the table serving as a movable body. Therefore, the table becomes large, and the weight also becomes heavy. Moreover, the thrust in the vertical direction by means of the polyphase coils is very small, and it has in practice been difficult to lift a table having a large weight only by the vertical thrust.

Moreover, the positioning apparatus requires a coil train having a size twice as large as the moving stroke of the table. Hence there is a problem in that the apparatus becomes large.

DISCLOSURE OF THE INVENTION

A first object of the present invention is to provide a positioning apparatus which can stably support a movable body on which an object to be positioned such as a wafer or the like is mounted, and precisely position the movable body.

A second object of the present invention is to provide a positioning apparatus which can position a movable body in a non-contact state without making a drive mechanism too large compared to the moving stroke of the movable body.

Another object of the present invention is to provide a drive unit which can be used in such a positioning apparatus, and an exposure apparatus which incorporates such a positioning apparatus and which can produce a semiconductor device or the like with high throughput and high accuracy.

To achieve these objects, the positioning apparatus according to the present invention is a positioning apparatus for positioning a movable body on which an object to be positioned is mounted, the positioning apparatus having a basic construction in that it comprises; a magnetism generation body incorporated in the movable body, a magnetic member formed so as to have the magnetism generation body therebetween, and a drive unit disposed between the magnetism generation body and the magnetic member, for driving the magnetism generation body, and the movable body is positioned by means of the magnetic member and the drive unit.

Under this basic construction, with a (first) positioning apparatus of the present invention, the magnetism generation body (8) (for example, one or a plurality of flat plates) generates a magnetic flux directed toward one direction perpendicular to a moving plane of the movable body (6), the magnetic member (10, 15A to 15C, 16) forms a magnetic circuit together with the magnetism generation body (8), and the drive unit incorporates a lifting coil (14) which is wound so as to generate a variable thrust in a direction perpendicular to the moving plane, with respect to the magnetism generation body (8), and the movable body (6) is positioned in a non-contact state by means of the magnetic member (10, etc.) and the drive unit (11).

According to such a (first) positioning apparatus, a movable table (6, 8) comprising the movable body (6) and the magnetism generation body (8) can be made thin and lightweight. At this time, the magnetism generation body (8) may work as the movable body (6). Moreover, with the present invention, principally two magnetic circuits are formed. The first magnetic circuit is a magnetic circuit in which the magnetic flux coming out from the N-pole of the magnetism generation body (8) returns to the S-pole of the magnetism generation body (8) via the magnetic member on the upper face or the bottom face and the magnetic member facing this. The second magnetic circuit is a magnetic circuit in which the magnetic flux coming out from the N-pole of the magnetism generation body (8) leaks into space, and returns to the S-pole, for example through the magnetic member on the upper face.

The first and the second magnetic circuits generate attraction to the magnetic member on the upper face and the bottom face with respect to the movable table (6, 8), respectively, and by magnetically controlling the attraction, a lifting force is generated in the movable table. Hence the movable table can support the deadweight. As a result, the lifting coil (14) of the drive unit (11) has only to adjust the repulsion or the attraction within a predetermined range. Hence the heat generation thereof becomes minimum. To magnetically control the attraction, the height of the movable table may be adjusted, or the size of the coil in the drive unit (11) may be adjusted, or the permeance of the magnetic member may be adjusted.

By controlling the repulsion or the attraction in the lifting coils, of for example three or more drive units (11), the height of the movable table and the inclination around two axes can be controlled. That is to say, positioning in the height direction can be accurately performed.

With an other (second) positioning apparatus according to the present invention, the magnetism generation body (8) generates a magnetic flux directed toward one direction perpendicular to a moving plane of the movable body (6), the magnetic member (10, 15A to 15C, 16) forms a magnetic circuit together with the magnetism generation body (8), and the drive unit (11) incorporates: a core member (20) which passes the magnetic flux within the magnetic circuit; a first thrust generation coil (12A) wound around the core member so as to generate a thrust consisting of a Lorentz force in a first direction within the moving plane, with respect to the magnetism generation body (8); and a second thrust generation coil (13A) wound around the core member so as to generate a thrust consisting of a Lorentz force in a second direction crossing the first direction within the moving plane, with respect to the magnetism generation body (8).

According to the (second) positioning apparatus, by the reaction force to the Lorentz force generated by the electric current flowing in the thrust generation coils (12A, 13A) on the bottom face or the upper face of the movable table and the magnetic flux of the magnetism generation body (8), a two-dimensional thrust is generated with respect to the movable table. Therefore, by providing for example three thrust generation coils (two for the drive unit), a two-dimensional large thrust and a rotation force can be imparted to the movable table. That is to say, the movable table (6, 8) can be precisely positioned in the two-dimensional plane.

Then, by combining the (first) positioning apparatus and the (second) positioning apparatus, the movable table can be positioned precisely with six degrees of freedom in a non-contact state. At this time, since the installation area of the plurality of drive units may be commeasurable with respect to the moving stroke of the movable table, the positioning apparatus does not become large.

Moreover, the plurality of drive units are not directly connected magnetically. Hence the inductance of each coil can be reduced, and since the response of the current is improved, positioning can be performed at a high speed.

With an other (third) positioning apparatus of the present invention the magnetism generation body (8) generates a magnetic flux directed toward one direction perpendicular to a moving plane of the movable body (6), the magnetic member (10, 15A to 15C, 16) forms a magnetic circuit together with the magnetism generation body (8), and the drive unit (70X; 74X) incorporates: a core member (71; 75) which passes the magnetic flux within the magnetic circuit; a (first) thrust generation coil (73; 73d, 73e) wound around the core member so as to generate a thrust consisting of a Lorentz force in a direction (first direction) along the moving plane, with respect to the magnetism generation body; and a lifting coil (second thrust generation coil) (72A, 72B;76) wound around the core member so as to generate a variable thrust in a direction (second direction) perpendicular to the moving plane, with respect to the magnetism generation body.

Also according to such a (third) positioning apparatus, the majority of the weight of the movable body is supported by the magnetism generation body and the magnetic circuit. The height and the inclination of the movable body is controlled by the lifting coil, and the position of the movable body in the moving plane is controlled by the thrust generation coil.

In this case, as one example, the core member (71) is an arch-like member with a convex part facing the magnetism generation body side, and two end portions of this arch-like member are magnetically coupled to the magnetic member. The thrust generation coil (73) is wound around a middle portion of the arch-like member, and has an outside area substantially larger than an area of the core member, and an area on the inside thereof is formed narrower than the outside area. The lifting coils (72A, 72B) are wound on the two end portions of the arch-like member.

In these cases, it is desirable to a provide a position measurement system (17X, 17Y, 18X, 18Y1, 18Y2) for measuring the position of the movable body in the moving plane. By driving the drive unit (11) based on the position measurement results, the positioning of the movable body is performed with high precision by a closed loop method.

Moreover, a deformation measurement system (9A to 9D) for measuring the deformation of the magnetism generation body (8) may be provided. By providing for example, actuators extending and contracting in the vicinity thereof, and by driving these actuators so as to offset the detected distortion, the deformation of the magnetism generation body (8) can be suppressed. Instead of using actuators, deformation may be controlled by the lifting force generated by a plurality of lifting coils (14).

Furthermore, a magnetostriction member which deforms so as to independently offset deformation due to the magnetism of the magnetism generation body may be adhered to the magnetism generation body (8). As the magnetostriction member, a member formed for example from a ferrite garnet type or rare-earth alloy type magnetostrictive material can be used. When the magnetostrictive material is used in this manner, a magnetostrictive material which contracts due to the magnetic field ($CoFe_2O_{4_4}$, $SmFe_2$ or the like) has only to be adhered at a position where the magnetism generation body tends to be distorted in a convex shape due to the magnetic field. Alternatively, a magnetostrictive material which expands due to the magnetic field ($TbFe_2$, 70% by weight Tb −30% by weight Fe or the like) has only to be adhered at a position where the magnetism generation body tends to be distorted in a concave shape due to the magnetic field.

An other (fourth) positioning apparatus of the present invention has first and second magnetism generating bodies (45A, 45B) for respectively generating a magnetic flux in one direction perpendicular to the moving plane of the movable body (44). The magnetic member (46) is arranged in a coupled state so as to have the first and second magnetism generating bodies (45A, 45B) between upper and lower portions thereof, and forms respective magnetic circuits together with the first and second magnetism generating bodies (45A, 45B). The drive unit comprises a first drive unit (11) disposed between the first magnetism generation body (45) and the magnetic member (46) for driving this magnetism generation body, and a second drive unit (11C) disposed between the second magnetism generation body (45B) and the magnetic member (46) for driving this magnetism generation body.

The first drive unit (11) has a lifting coil (14) wound so as to generate a variable thrust in a direction perpendicular to the moving plane, with respect to the first magnetism generation body (45A) within the magnetic circuit, and the second drive unit (11C) has a lifting coil (14) wound so as to generate a variable thrust in a direction perpendicular to the moving plane, with respect to the second magnetism generation body (45B) within the magnetic circuit. This gives an arrangement for positioning the movable body in a non-contact state by means of the magnetic member, the first drive unit and the second drive unit.

According to the other (fourth) positioning apparatus, the movable body (44) on which an object to be positioned such as wafer or the like is mounted, is made for example from an elongate and flat non-magnetic material, and the first and second magnetism generating bodies (45A, 45B) are connected to opposite end portions of the movable body (44). The first drive unit (11) is disposed at the bottom face or the upper face (or at both faces) at one end of the movable body (44), and the second drive unit (11C) is disposed at the bottom face or the upper face (or at both faces) at the other end of the movable body (44). The majority of the force for lifting with respect to the movable body (44) is given by this magnetic circuit (first magnetic circuit) and the second magnetic circuit formed by the magnetic flux leaking into space.

Moreover, assuming that the two directions in the moving plane of the movable body (44) are the X direction and the Y direction, and the direction perpendicular to the moving plane is the Z direction, the movable body (44) is precisely positioned in the Z direction in a non-contact state by means of these drive units. At this time, a magnetic flux is practically non existent in the central portion of the movable body (44). Hence this positioning apparatus can also be applied to an electron beam transfer apparatus or the like.

In these cases, it is desirable to have a construction for dispersing to the floor the reaction force due to the thrust generated at the time of positioning of the movable body. Thereby, the occurrence of oscillation is suppressed. Moreover, the magnetism generation body may be monopolar (when there are a plurality of magnetism generating bodies, all of them generate a magnetic flux in the same direction) or multipolar. Furthermore, it is desirable that the movable body (6) and the magnetism generation body (8) be a flat shape. Thereby, the movable body (table) can be made thin and lightweight. Furthermore, an auxiliary magnetic member (77, 78) comprising a high magnetic permeability material may be disposed on at least one of an upper face and a bottom face of the magnetism generation body (8). With this auxiliary magnetic member, the force for lifting with respect to the movable body (6) due to the magnetic circuit becomes large, and the thrust due to each coil becomes large.

Moreover, a plurality of lifting coils comprise coils (83) wound around magnetic cores (79a) respectively comprising a high magnetic permeability material, in a direction perpendicular to the plane in which the movable body (6) moves. A plurality of first coils for generating thrust comprise coils (81A) wound around the respective magnetic cores (79a) in a first direction. A plurality of second coils for generating thrust comprise coils (82A) wound around the respective magnetic cores (79a) in a second direction. It is desirable that a plurality of magnetic cores (79a) constitute part of the magnetic members. Hence, members for generating the lifting force and the thrust with respect to the magnetism generation body (8) can be brought together in a plurality of drive units (11) having the same construction, enabling easy control and simple construction. Furthermore, it is desirable to arrange in the vicinity of the drive unit (11) a cooling apparatus (21) for cooling the drive unit (mainly the coils).

With an other (fifth) positioning apparatus of the present invention, the drive unit has a plurality of drive coils (87, 88) arranged at a bottom face side of the magnetism generation body (8) such that there is always a drive coil crossing an edge portion of the magnetism generation body, and comprises; a position detection apparatus (18X, 18Y1, 18Y2) for detecting a position of the movable body in the moving plane of the movable body (6), and a control system (22) for discriminating from amongst the drive coils, corresponding to the detection results of the position detection apparatus, a lifting drive coil (88A) which is fully contained at the bottom face of the magnetism generation body, and a lateral shift drive coil (87A, 87B) located in a position crossing an edge of the magnetism generation body. This gives an arrangement for positioning the movable body by means of a thrust generated in the magnetism generation body by the lateral shift drive coil, in a condition where the movable body is supported in a non-contact state by the lifting drive coil.

According to the (fifth) positioning apparatus, when an electric current is made to flow in the lateral shift drive coil located at a position crossing the edge of the magnetism generation body (8), a Lorentz force is generated by means of the magnetic flux in the magnetism generation body (8) and the current, and the reaction force thereto becomes the thrust for lateral shifting of the magnetism generation body (8). Therefore, it is not particularly necessary to use a polyphase coil. Then, if for example there are always three or more lateral shift drive coils, and at least one of them has a different thrust direction, a two-dimensional thrust and a rotation force can be imparted to the magnetism generation body (8). Therefore, as a result, the movable body (6) can be positioned with six degrees of freedom in a non-contact state at a high speed.

In this case, with the plurality of drive coils, a first coil (87) wound for example in a rectangular or elliptic shape, and a second coil (88) obtained by turning the first coil through a predetermined angle, are arranged two-dimensionally. By combining these, it can be easily arranged so that there is always a drive coil crossing the two direction edges of the magnetism generation body (8).

The exposure apparatus of the present invention comprises the above described positioning apparatus of the present invention, and transfers a mask pattern onto a substrate (W) positioned by this positioning apparatus. In this case, the substrate (W), as the object to be positioned, can be positioned at a high speed in a non-contact state by means of the positioning apparatus of the present invention. As the exposure apparatus, an electron beam transfer apparatus or the like can be used, other than the optical type projection exposure apparatus.

The drive unit according to the present invention, with a drive unit (70X; 74X) which is arranged in a magnetic circuit formed by a magnetism generation body (8) and a magnetic member (10, 15A to 15C, 16), and which generates a Lorentz force, comprises; a core member (71; 75) for passing a magnetic flux in a first direction in the magnetic circuit and magnetically coupling the magnetic members, and a coil (73; 73d, 73e) wound around the core member in a second direction orthogonal to the first direction, the coil being wound so that the area becomes large on the magnetism generation body side and becomes small on the side opposite to the magnetism generation body side.

In this case, the core member as one example is an arch-like member (71) with a convex part facing the magnetism generation body (8) side, and two end portions of the arch-like member are magnetically coupled to the magnetic member (10). The second direction coil (73) is wound around a middle portion of the arch-like member (71). Moreover, the core member as one example is a rectangular member (75) having a plurality of planes crossing each other, and the second direction coil (73) is wound around the crossing planes.

Furthermore, the core member preferably comprises a first direction coil (72A, 72B, 76) wound in the first direction. Moreover, the first direction coil (29) may be arranged in a condition wound around a plurality of the core members.

The positioning apparatus of the present invention comprises the above described drive unit of the present invention, and performs positioning of a movable body (5) on which an object to be positioned is mounted and in which the magnetism generation body (8) is incorporated, by means of the drive unit and the magnetic member (10, 15A to 15C, 16).

Furthermore, the exposure apparatus of the present invention comprises the positioning apparatus incorporating the above described drive units of the present invention, and transfers a mask pattern onto a substrate (W) positioned by this positioning apparatus. In this case, the substrate (W), as the object to be positioned, can be positioned at high speed in a non-contact state by means of the positioning apparatus of the present invention.

BEST MODE FOR CARRYING OUT THE INVENTION

Below is a description of preferred embodiments of the present invention with reference to the accompanying drawings. These embodiments show a case where the present invention is applied to a semiconductor wafer positioning section in a projection exposure apparatus.

[First Embodiment]

Figure 1:
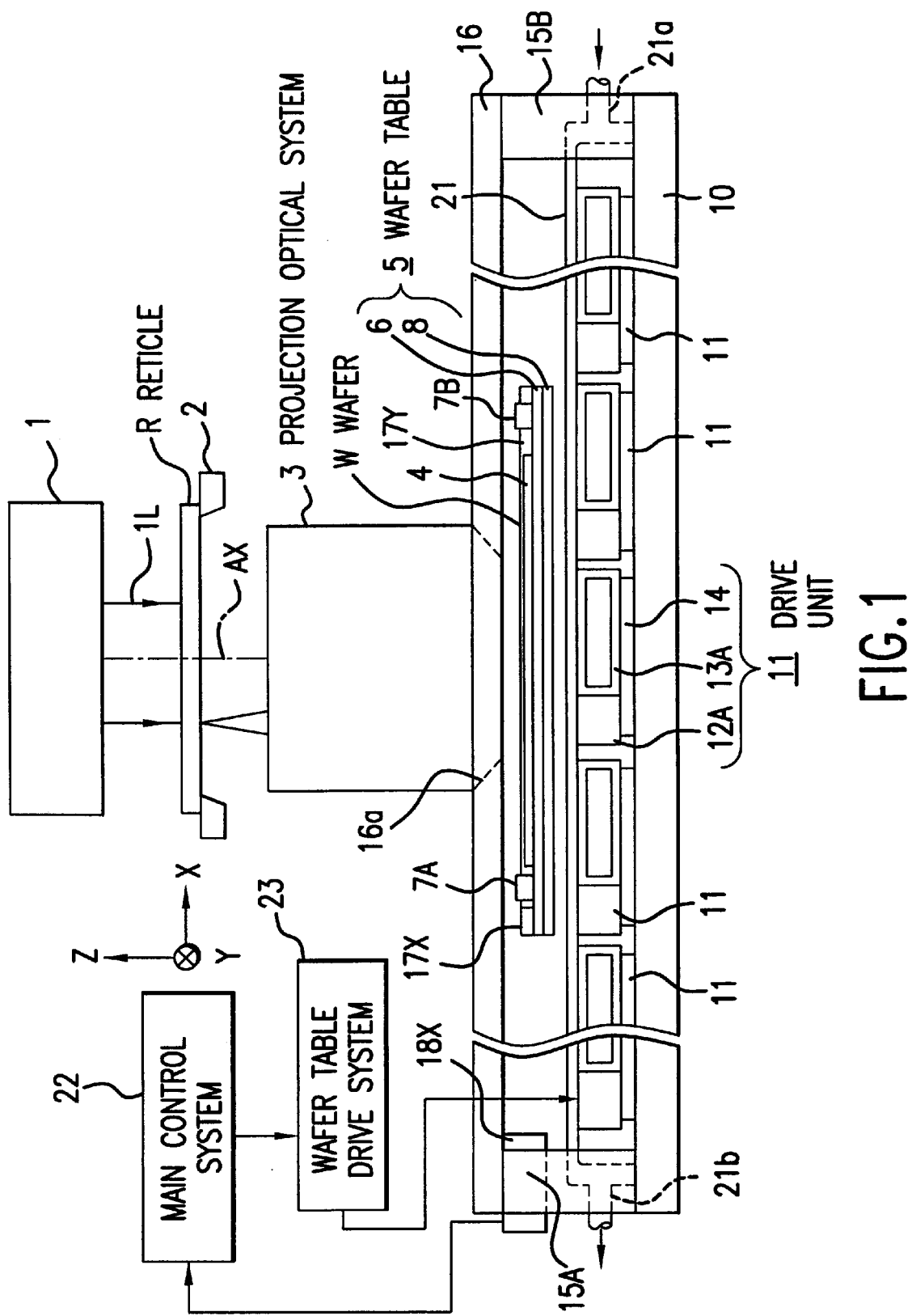
FIG. 1 is a schematic structural diagram showing a projection exposure apparatus of an embodiment of the present invention.

FIG. 1 is a schematic structural diagram showing a projection exposure apparatus of this embodiment. In FIG. 1, a pattern formed on the lower side of a reticle R is illuminated by exposure light IL (a line spectrum such as an i beam of a mercury lamp, or an excimer laser beam or the like) from an illumination optical system 1, with uniform illuminance distribution, and under the exposure light IL, the pattern in the reticle R is projected onto a predetermined shot region on a semiconductor wafer (hereinafter simply referred to as a "wafer") W via a projection optical system 3 with a predetermined projection magnification $\beta$($\beta$is for example ¼, ⅕ or the like). On the surface of the wafer W, a photoresist is applied, and the surface thereof approximately coincides with an image surface of the projection optical system 3. Next, description will be made taking the Z axis parallel with the optical axis AX of the projection optical system 3, the X axis parallel with the paper face of FIG. 1 in a plane perpendicular to the optical axis AX, and the Y axis perpendicular to the paper face in FIG. 1.

The reticle R is held on a reticle stage 2 capable of precise movement in the X direction, the Y direction and the rotation direction, and the position of the reticle stage 2 is controlled based on the measurement of a laser interferometer (not shown). On the other hand, the wafer W in thin disk form in this embodiment is held on a wafer holder 4 (see FIG. 2) by means of, for example electrostatic attachment, and the wafer holder 4 is fixed on a wafer table 5 having an overall rectangular and flat shape. The wafer table 5 in this embodiment is obtained by laminating together in order from the wafer holder 4 side, a ceramic plate 6 as a non-magnetic material and one magnet plate 8 which generates a uniform magnetic flux in the Z direction. The magnet plate 8 is one permanent magnet in which, for example the bottom face side is the N-pole, and the upper face side is the S-pole (the reverse is also possible).

Moreover, a flat bottom yoke 10 comprising a ferromagnetic body is arranged at the bottom face side of the wafer table 5 so as to cover the whole face of the moving range of the wafer table 5, and the bottom yoke 10 is installed on a floor (not shown) directly or via a vibration-isolating mechanism such as a rubber vibration isolator. Multiple drive units 11 are attached on the upper face of the bottom yoke 10, and the drive circuit of each drive unit 11 is incorporated in a wafer table drive system 23. The drive units 11 respectively impart variable thrust (to be described later in detail) in the X direction, the Y direction and the Z direction to the magnet plate 8 (thus also to the wafer table 5). These drive units 11 are covered with a cover member 21 comprising a thin plate of a non-magnetic material which provides a narrow cavity portion. The cover member 21 also functions as a cooling apparatus for the drive units 11, and a refrigerant comprising a low temperature liquid is fed from a refrigerant feeder (not shown), to the cavity portion of the cover member 21 via a supply port 21a. The refrigerant which has flowed in the cover member 21 and which has absorbed heat generated from the multiple drive units 11 is returned to the refrigerant feeder from a discharge port 21b. The quantity of heat generated in each drive unit 11 in this embodiment is small, however even this small quantity of heat generated is carried to the outside by the refrigerant in the cover member 21. Hence the increase in the temperature of the wafer table 5 is small, and positioning is performed with high precision.

Moreover, a flat top yoke 16 comprising a ferromagnetic body is arranged on the upper side face of the wafer table 5, and a tip portion of the projection optical system 3 is inserted into an opening 16a in a central portion of the top yoke 16. A lens-barrel of the projection optical system 3 is formed from a ferromagnetic body, and the tip portion of the projection optical system 3 becomes a part of the top yoke 16.

The bottom yoke 10 and the top yoke 16 are coupled by supports 15A to 15D (in FIG. 1, only 15A and 15B can be seen) comprising a ferromagnetic body at four corners, so that the bottom yoke 10, the magnet plate 8, the top yoke 16 and the supports 15A, 15B and the like form a first closed magnetic circuit. The supports 15A to 15D may be provided with a vibration isolation member (for example, a spring member comprising a ferromagnetic body). By providing the vibration isolation member, the reaction force caused by the drive unit 11 is not transmitted to the projection optical system 3, and the reaction force to the thrust generated at the time of positioning the movable body can be dispersed to the floor.

Moreover, a second magnetic circuit is also formed wherein the magnetic flux leaked into space from the N-pole of the magnet plate 8 returns to the S-pole of the magnet plate 8 through the top yoke 16. In this embodiment, a steady state force for lifting is given to the wafer table 5 mainly by the second magnetic circuit. By actually generating a thrust for attracting the magnet plate 8 to the bottom yoke 10 side by means of the drive unit 11, the magnet plate 8 (wafer table 5) is stably supported at a desired position in the Z direction in a floating state.

Essentially, since the attraction of the magnet has a nonlinear negative rigidity, it is thought to be difficult to control the position of the wafer table 5 in the Z direction. By virtue of a magnet field analysis of the second magnetic circuit in this embodiment however, it was found that while the steady state lifting force has negative rigidity, the degree of the nonlinearity was very small. Therefore, the position in the Z direction can be easily stabilized to a predetermined target value, and response is excellent.

Furthermore, columnar soft touchdown members 7A to 7C (see FIG. 2) comprising a synthetic rubber or the like are fixed at three points on the periphery of the wafer holder 4 on the upper face of the wafer table 5, so that even if the wafer table 5 is attracted toward the top yoke 16, the impact force is absorbed by the touchdown members 7A to 7C.

An X axis movable mirror 17X is fixed to the −X direction end portion of the upper face of the plate 6 of the wafer table 5, and a Y axis movable mirror 17Y is fixed to the +Y direction end portion. A laser beam from a laser interferometer 18X is irradiated parallel with the X axis onto the movable mirror 17X, and laser beams from two laser interferometers 18Y1, 18Y2 (see FIG. 2) arranged in parallel are irradiated parallel with the Y axis onto the movable mirror 17Y. The laser interferometers 18X, 18Y1 and 18Y2 respectively measure the displacement of the corresponding movable mirrors 18X, 18Y, with a resolution of for example 0.001 $\mu$m to 0.01 $\mu$m, and the measurement result is output to a main control system 22 which generally controls the operation of the whole apparatus in FIG. 1. In this case, the X coordinate and the Y coordinate of the wafer table 5 (wafer W) can be respectively determined from, for example the mean value of the measurement of the laser interferometer 18X and the measurements of the laser interferometers 18Y1 and 18Y2, while the rotation angle of the wafer table 5 can be determined from the difference of the measurements of the two Y axis laser interferometers 18Y1 and 18Y2. The main control system 22 controls the thrust due to the multiple drive units 11 arranged at the bottom face side of the wafer table 5 via the wafer table drive system 23, based on these measurements, and performs positioning of the wafer table 5 (wafer W).

Moreover, though not shown, on the side (a part of the top yoke 16) of the projection optical system 3, there is also arranged a focal position detection system of an oblique incidence method type which projects a slit image or the like onto the surface of the wafer W, and detects a defocused quantity of the wafer W from a side slip quantity of the slit image reimaged by the reflected light from the wafer W. Based on the output and the like of the focal position detection system, the main control system 22 controls the position in the Z direction and the angle of inclination of the wafer W by an autofocus method, to thereby align the surface of the wafer W with the image surface in the projection optical system 3. Then, at the time of exposure, when the exposure on a certain shot region on the wafer W has been completed, such operation is repeated in a step and repeat method so that the wafer W is stepped at a high speed in a non-contact state via the plurality of drive units 11, the next shot region is shifted to the exposure field of the projection optical system 3, and the pattern image in the reticle R is projected and exposed on the shot region, to thereby perform exposure on each shot region of the wafer W.

As described above, the thrust in the X direction, the Y direction and the Z direction is imparted to the magnet plate 8 of the wafer table 5 in this embodiment, by means of the multiple drive units 11 arranged at the bottom face thereof. Below is a detailed description of the construction and operation of the drive units 11.

Figure 2:
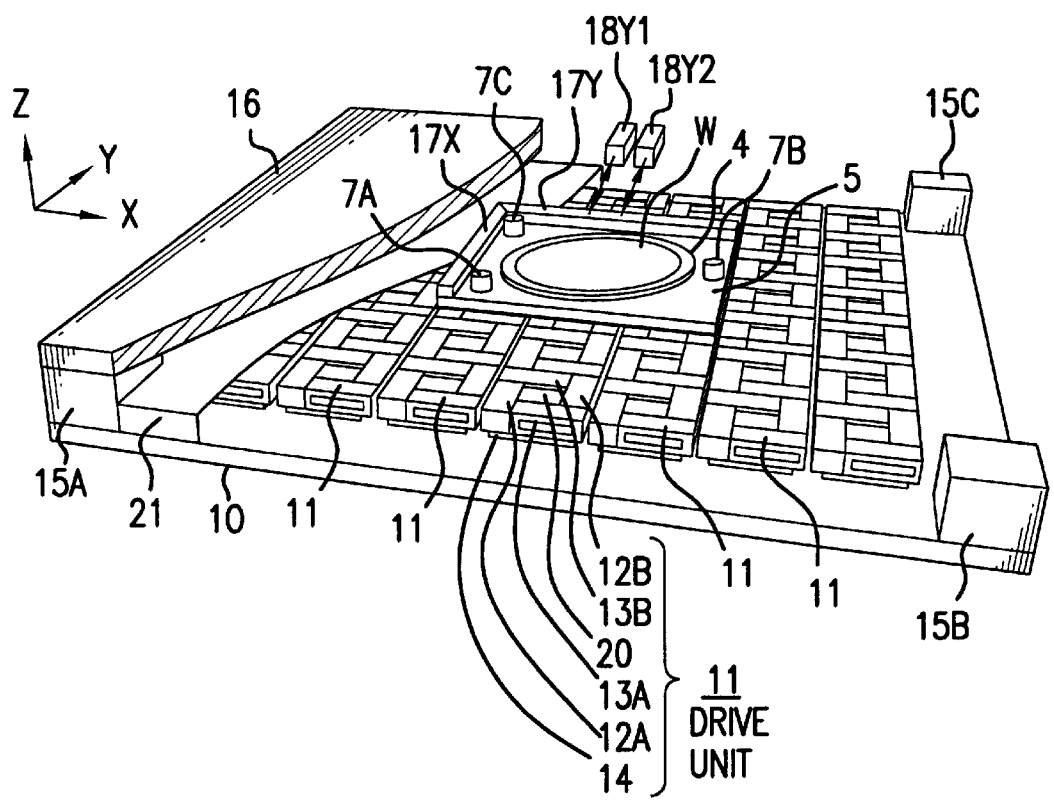
FIG. 2 is a partially cutaway perspective view of FIG. 1 showing the construction from a top yoke 16 to a bottom yoke 10 in FIG. 1.

FIG. 2 is a perspective view of FIG. 1 with the top yoke 16 and the cover member 21 in FIG. 1 partially cut away. As shown in FIG. 2, in the bottom yoke 10, multiple drive units 11 (in this example, in 7 rows×7 columns) having the same construction are incorporated in the X direction and the Y direction at a predetermined pitch so as to cover the whole region where the wafer table 5 (wafer W) moves. In this case, the array pitch of the drive units 11 is so set that the drive units 11 are always collectively arranged in at least 3 rows×3 columns at the bottom face of the wafer table 5. Each drive unit 11 respectively comprises; a core 20, X coils 12A and 12B which are coils for imparting a thrust in the X direction to the magnet plate 8 (wafer table 5), Y coils 13A and 13B which are coils for imparting a thrust in the Y direction to the magnet plate 8 (wafer table 5), and a Z coil 14 for generating a magnetic flux in the Z direction.

In this case, since the plurality of drive units 11 are not directly connected magnetically with each other, the inductance of each coil is reduced, and the response at the time of changing over the driving current is also good.

Figures 3A, 3B:
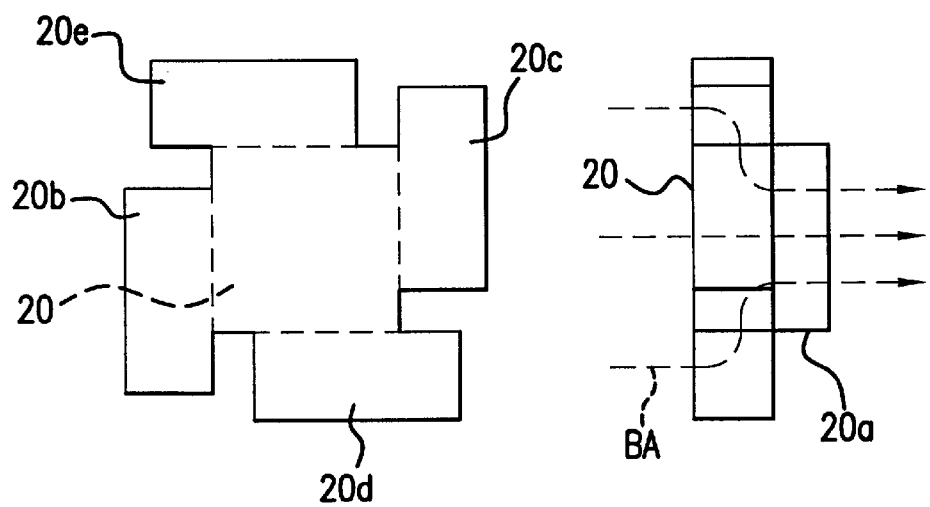
FIG. 3(a) is a plan view of a core 20 in a drive unit 11 in FIG. 2.
FIG. 3(b) is a side vi thereof.

FIG. 3(a) is a plan view showing a core 20 for the drive unit 11 comprising a ferromagnetic body, and FIG. 3(b) is a side view thereof. As shown in FIGS. 3(a) and (b), the section of the core 20 is in a shape with four flange portions 20b to 20e also serving as rectangular bobbins attached on the upper side face of a square pillar 20a. As a result, the magnetic flux BA passing through the flange portions 20b to 20e is bent and passes through the inside of the square pillar 20a. Hence the magnetic flux is practically non existent on the bottom face of the flange portions 20b to 20e.

Figure 4:
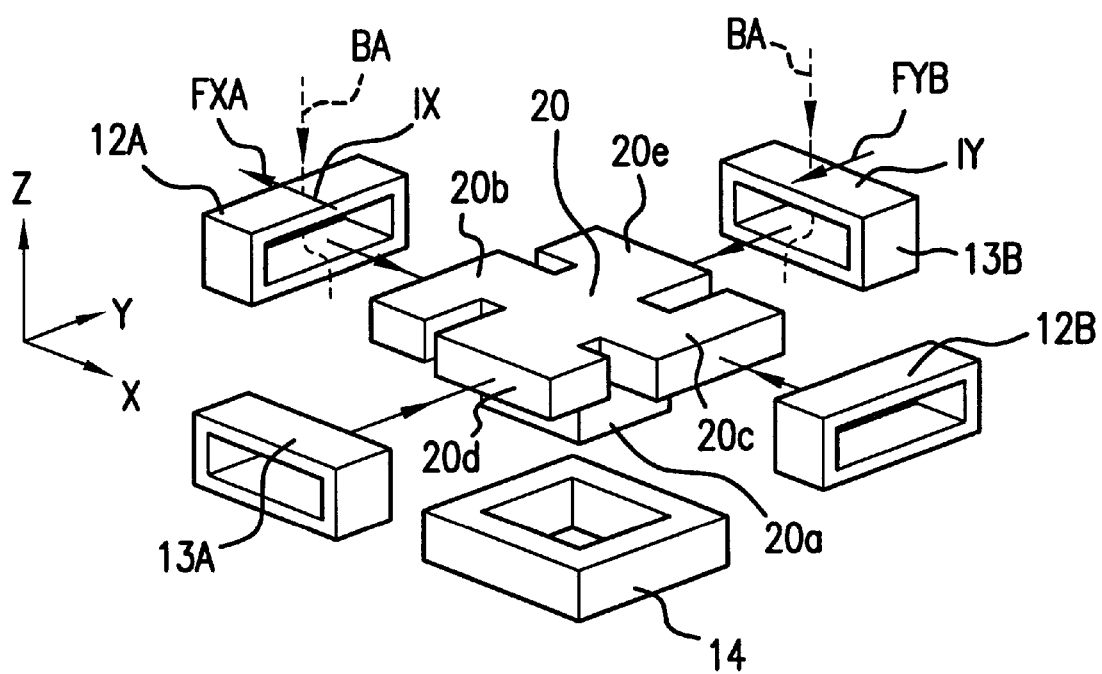
FIG. 4 is an exploded perspective view showing the drive unit 11 in FIG. 2.

FIG. 4 is an exploded perspective view showing the drive unit 11. In the condition installed on the bottom yoke 10, then as shown in FIG. 4, the core 20 is positioned so that the flange portions 20b and 20c face the −X direction and the +X direction respectively. The X coils 12A and 12B are wound respectively around the flange portions 20b and 20c in the X direction of the core 20, that is, around the axis parallel with the X axis, the Y coils 13A and 13B are wound respectively around the flange portions 20d and 20e in the Y direction of the core 20, that is, around the axis parallel with the Y axis, and the Z coil 14 is wound around the square pillar 20a at the bottom of the core 20, that is, around the axis parallel with the Z axis, thereby constructing the drive unit 11. Other drive units are constructed in the same manner.

In this case, the electric current IX flowing, for example in the +Y direction (or −Y direction) on the upper part and in the −Y direction (or +Y direction) on the bottom part is supplied to the X coil 12A, but since the magnetic flux BA passing through the upper part of the X coil 12A does not pass through the bottom part due to the action of the core 20, a Lorentz force FXA in the X direction acts on the X coil 12A as a whole. A Lorentz force in the X direction similarly acts on the X coil 12B. On the other hand, the electric current IY flowing, for example in the −X direction (or +X direction) on the upper part and in the +X direction (or −X direction) on the bottom part is supplied to the Y coil 13B, but since the magnetic flux BA passing through the upper part of the Y coil 13B does not pass through the bottom part, a Lorentz force FYB in the Y direction acts on the Y coil 13B as a whole, while a Lorentz force in the Y direction similarly acts on the other Y coil 13A.

Moreover, by energizing the Z coil 14, variable repulsion or attraction is generated with respect to the magnet plate 8 above the core 20. At this time, the Z coil 14 is arranged in the vicinity of the junction of the core 20 and the bottom yoke 10, under the X coils 12A, 12B and the Y coils 13A and 13B. Since the Z coil 14 surrounds the whole junction, it can give a magnetomotive force to the entire core 20. Therefore, it can give a relatively linear thrust in the Z direction with respect to the wafer table 5. If the construction is such that the Z coil 14 gives the magnetomotive force partially to the core 20, a local magnetic circuit is formed in the core 20, and the force generated by the Z coil 14 becomes very non-linear, and for example, even if it is tried to lift the wafer table 5, an attraction may act on the wafer table 5.

Figure 5:
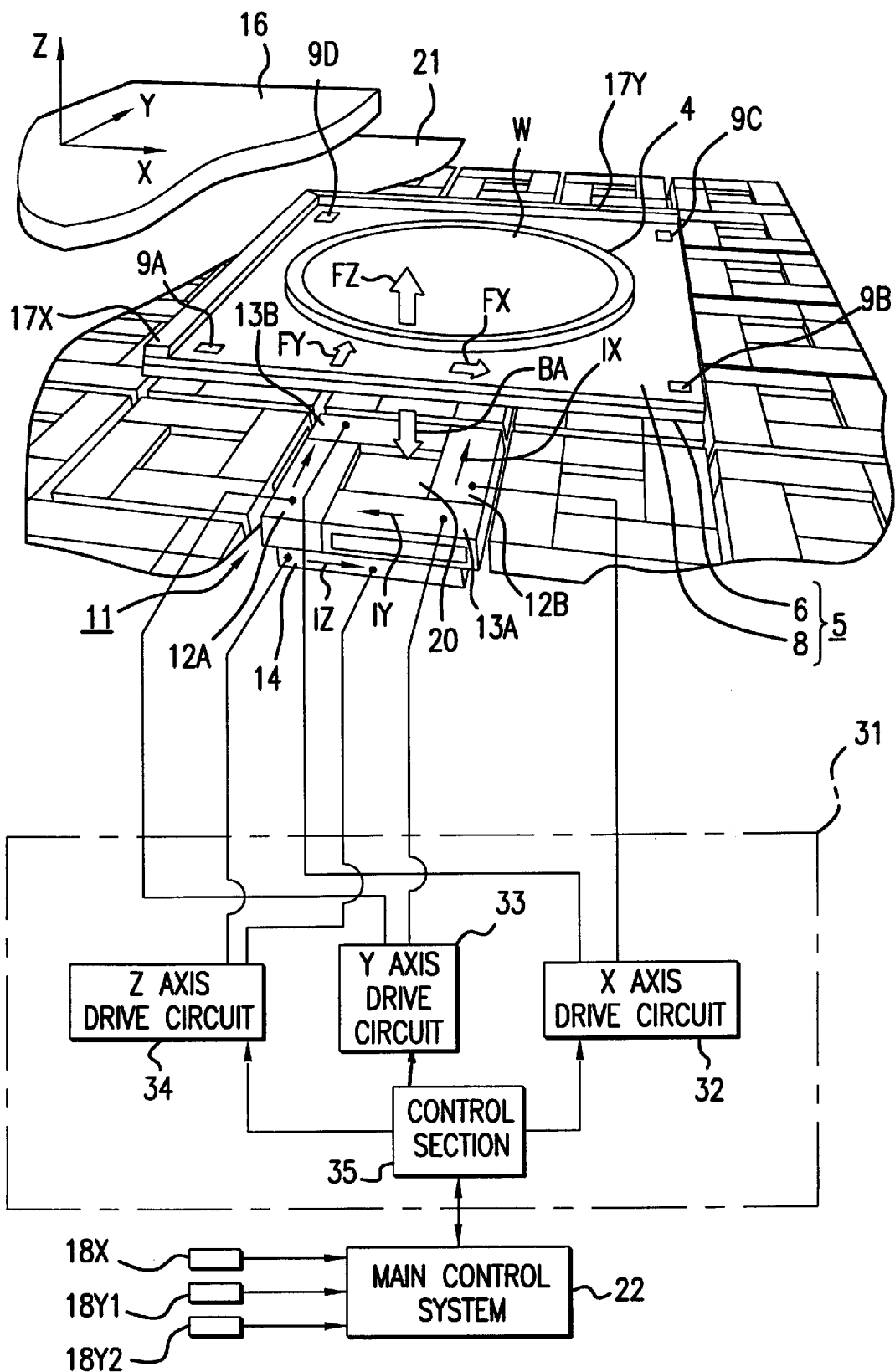
FIG. 5 is a diagram used for the explanation of a drive circuit of the drive unit 11 in FIG. 2 and the operation of the drive unit 11.

Next is a description of the construction of the drive circuit of the drive unit 11 and the operation of the drive unit 11, with reference to FIG. 5.

FIG. 5 is an enlarged view of part of FIG. 2. In this figure, attention is given to one drive unit 11 located at the bottom face of the wafer table 5. In this case, the magnetic flux BA going, for example in the −Z direction from the magnet plate 8 to the drive unit 11 is generated by means of the magnet plate 8 in the wafer table 5, and the bottom yoke 10, the top yoke 16 and the like in FIG. 2.

Furthermore, a drive circuit 31 is connected to the drive unit 11, and a control section 35 in the drive circuit 31 controls the operation of each circuit under the instruction from the main control system 22. In the drive circuit 31, an X-axis drive circuit 32, a Y-axis drive circuit 33 and a Z-axis drive circuit 34 are provided. The X-axis drive circuit 32 supplies the electric current IX flowing in the Y direction on the upper part of the X coils 12A and 12B of the corresponding drive unit 11, the Y-axis drive circuit 33 supplies the electric current IY flowing in the X direction on the upper part of the Y coils 13A and 13B, and the Z-axis drive circuit 34 supplies the electric current IZ to the Z coil 14. As a result, as described with reference to FIG. 4, by means of the current IX flowing through the X coils 12A and 12B and the magnetic flux BA in the Z direction, a Lorentz force in the X direction is generated in the X coils 12A and 12B, and a thrust FX in the X direction is generated in the magnet plate 8 (wafer table 5) as a reaction force to the Lorentz force.

Similarly, a Lorentz force in the Y direction is generated in the Y coils 13A and 13B, by means of the current IY flowing in the Y coils 13A and 13B and the magnetic flux BA in the Z direction, and a thrust FY in the Y direction is generated in the magnet plate 8 (wafer table 5) as a reaction force to the Lorentz force. Since the thrust FX, FY is proportional to the respective currents IX, IY, the X-axis drive circuit 32 and the Y-axis drive circuit 33 respectively control the currents IX and IY according to the thrust instruction from the control section 35. The direction of the thrust IX and IY (±X direction, and ±Y direction) can be optionally set according to the direction of the corresponding respective currents IX and IY.

Furthermore, by controlling the value of the current IZ supplied from the Z-axis drive circuit 34 to the Z coil 14, a new variable magnetic flux passing through the Z coil 14 is generated as described above, and by means of this variable magnetic flux, a thrust FZ in the Z direction comprising a reluctance force acts on the magnet plate 8. The thrust FZ can also be set in either the +Z direction (repulsion) or the −Z direction (attraction) according to the direction of the current (sign) supplied to the Z coil. With the Z-axis drive circuit 34, the current IZ supplied to the Z coil 14 is controlled according to the thrust FZ instructed by the control section 35.

A drive circuit the same as the drive circuit 31 in FIG. 5 is respectively connected to each drive unit 11 in FIG. 2, and the wafer table drive system 23 in FIG. 1 is constituted by these multiple drive circuits 31. The coordinate in the X direction and the Y direction and the rotation angle of the wafer table 5 at this time can be determined from the measurements of the laser interferometers 18X, 18Y1 and 18Y2. Based on the result, the main control system 22 gives an instruction as to how much the wafer table is displaced in each portion, to the control section 35 in the drive circuit 31 of each drive unit 11, and the control section 35 generates predetermined thrusts by means of the corresponding coils, according to this instruction. Since the drive units 11 are always arranged in at least 3 rows×3 columns at the bottom face of the wafer table 5 in this embodiment, the wafer table 5 can be positioned with six degrees of freedom (displacement in the X direction, Y direction and Z direction, and rotation around the X axis, Y axis and Z axis), by combining the thrusts FX, FY, FZ in the X direction, Y direction and Z direction generated from these drive units 11 with respect to the magnet plate 8 (wafer table 5).

Furthermore, strain gauges 9A to 9D are adhered at four corners on the upper face of the plate 6 of the wafer table 5 of this embodiment. These strain gauges 9A to 9D are connected to a detection circuit (not shown) via a lead (not shown) having flexibility, and the strain quantity of the plate 6 detected by the detection circuit is supplied to the main control system 22. When strain of the magnet plate 8 and the plate 6 is detected, the main control system 22 corrects the strain by controlling the thrust in the Z direction by means of the plurality of drive units 11 at the bottom face of the wafer table 5.

The strain of the magnet plate 8 may be corrected independently by adhering a correcting plate comprising a magnetostrictive material which deforms according to the magnetic field, to the upper face or the bottom face of the magnet plate 8, rather than by correcting the strain actively in the above described manner. As the magnetostrictive material, for example, a ferrite garnet type ($CoFe_2O_4$ or the like) or a rare-earth alloy type (70% by weight Tb–30% by weight Fe, $SmFe_2$, $TbFe_2$, $Tb(CoFe)_2$ or the like) can be used. When the magnetostrictive material is used, then for example at a position where the magnet plate 8 tends to be distorted in a convex shape due to the magnetic field, a magnetostrictive material which contracts due to the magnetic field can be adhered, and at a position where the magnetism generation body tends to be distorted in a concave shape due to the magnetic field, a magnetostrictive material which expands due to the magnetic field can be adhered.

Figure 6A:
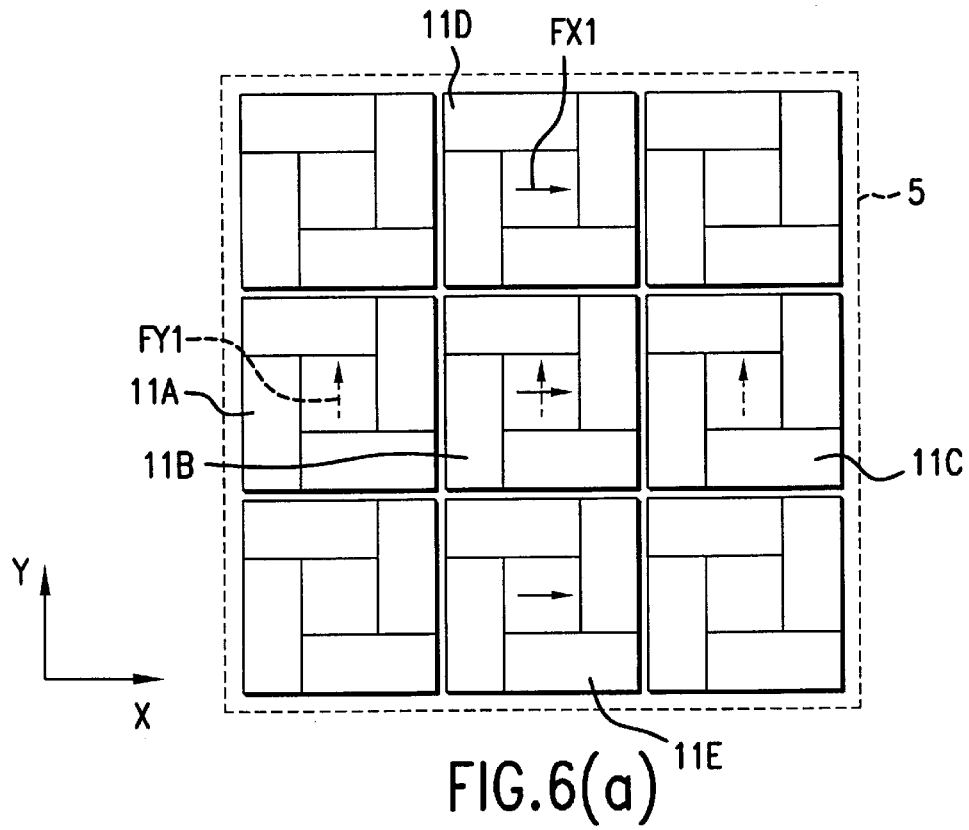
FIG. 6(a) is a plan view for the case of driving a wafer table 5 in the X direction and the Y direction using a plurality of the drive units 11 in FIG. 2.
Figure 6B:
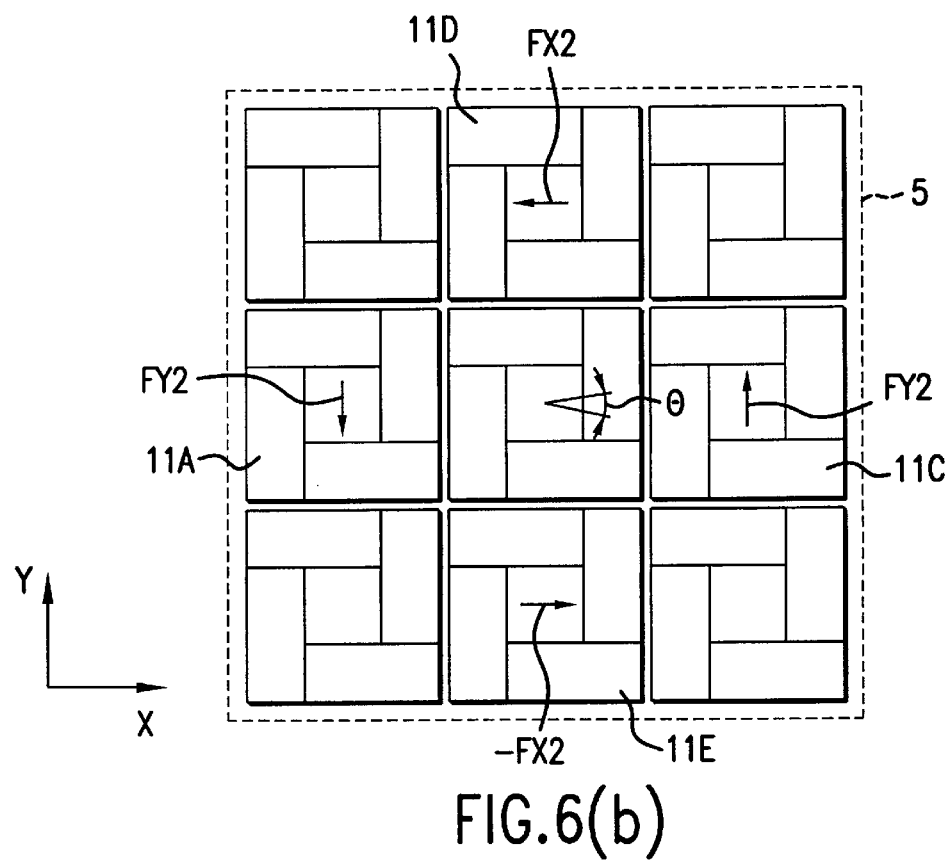
FIG. 6(b) is a plan view for the case of rotation thereof.

Next is a description with reference to FIG. 6 of one example of the operation when the wafer table 5 is displaced two-dimensionally. First, when the wafer table 5 (wafer W) is to be displaced in the Y direction, as shown in FIG. 6(a), the main control section 22 gives an instruction to generate the thrust FY1 in the Y direction to the control sections of the plurality of drive units 11A, 11B and 11C at the bottom face of the wafer table 5. According to this, the thrust FY1 in the Y direction acts on the wafer table 5 from the drive units 11A to 11C, to thereby displace the wafer table 5 in the Y direction. Similarly, when the wafer table 5 is to be displaced in the X direction, the thrust FX1 in the X direction can be made to act on the wafer table 5 from the plurality of drive units 11D, 11B and 11E at the bottom face of the wafer table 5.

As shown in FIG. 6 (b), when a rotation error θ occurs in the wafer table 5 (wafer W), the thrust FY2 in the −Y direction and the thrust −FY2 in the +Y direction are generated respectively from a pair of drive units 11A and 11C separated in the X direction at the bottom of the wafer table 5, and the thrust FX2 in the −X direction and the thrust −FX2 in the +X direction are generated respectively from a pair of drive units 11D and 11E separated in the Y direction, to thereby rotate the wafer table 5 so as to offset the rotation error θ. At this time, since the rotation angle of the wafer table 5 is monitored from the measurements of the laser interferometers 18Y1 and 18Y2 in FIG. 2, the rotation angle of the wafer table 5 can be accurately corrected with a closed loop based on the measurements.

As described above, with this embodiment, since the wafer table 5 on which the wafer W is mounted is driven in a non-contact state, the wafer W can be positioned at a high speed. Therefore, the throughput (productivity) of the exposure process is increased. Moreover, since the drive units 11 need only be arranged approximately over the whole face in the moving range of the wafer table 5, the positioning apparatus does not become large. Furthermore, for example in FIG. 1, the wafer W can be replaced through a notch portion (not shown) provided at the end portion of the top yoke 16.

Moreover, in this embodiment, the drive unit 11 may be disposed at the upper face side of the wafer table 5, or may be disposed at both the upper face and the bottom face sides of the wafer table 5. By disposing the drive unit 11 at both sides, a large thrust can be obtained.

Furthermore, with the above described embodiment, a focal position detection system of an oblique incidence method (not shown) for measuring the position in the Z direction on the surface of the wafer W is provided. However, alternatively a plurality of gap sensors may be provided on the bottom yoke 10 side, for measuring the space with the wafer table 5.

[Second Embodiment]

Figure 7:
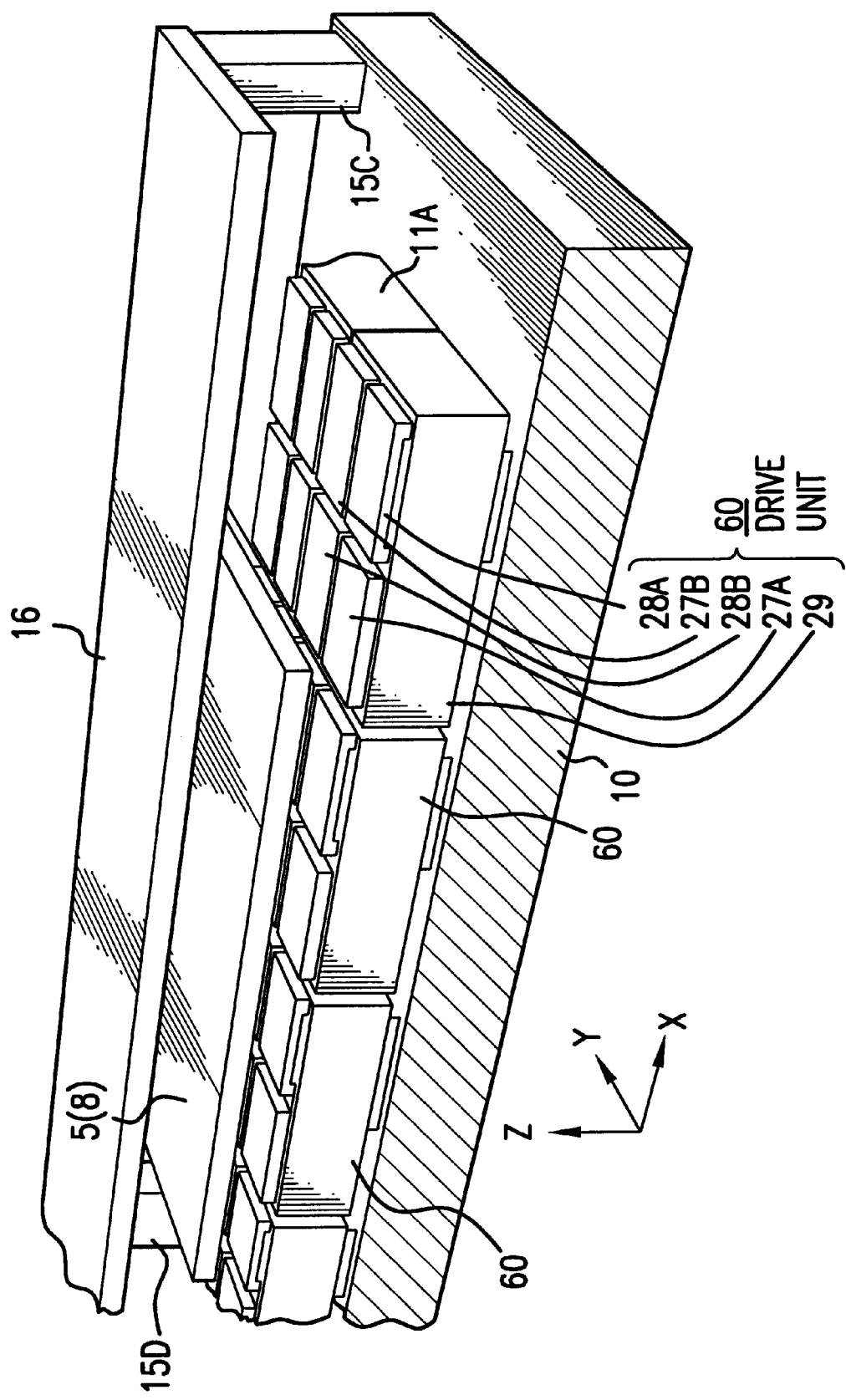
FIG. 7 is a sectional view showing the main parts of a projection exposure apparatus of another embodiment of the present invention.
Figure 8:
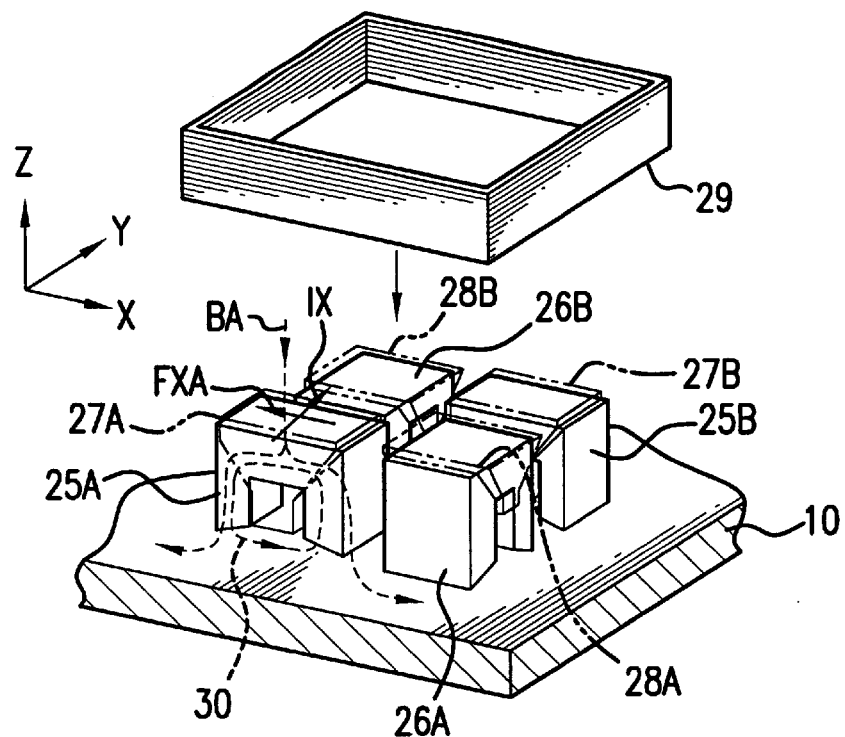
FIG. 8 is an exploded perspective view showing the drive unit 60 in FIG. 7.
Figure 9:
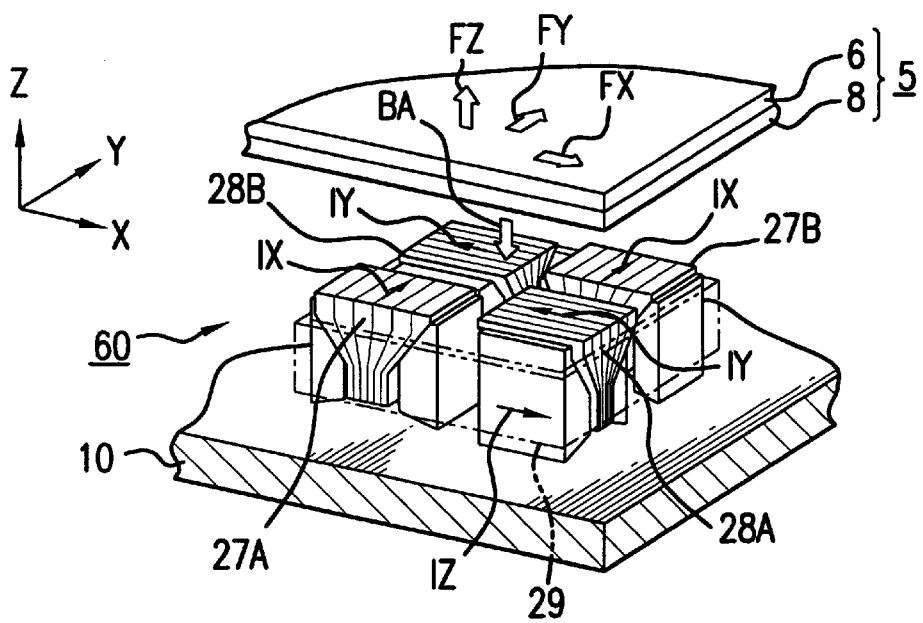
FIG. 9 is a diagram used for the explanation of the drive unit 60 in FIG. 7.

Next is a description of a second embodiment of the present invention with reference to FIG. 7 to FIG. 9. This embodiment uses a drive unit different from that of the first embodiment. Similar parts corresponding to those in FIG. 1 and FIG. 2 are denoted by the same reference numerals in FIG. 7 to FIG. 9, and detailed description thereof is omitted.

FIG. 7 is a sectional view showing the main parts on the wafer stage side of the projection exposure apparatus of this embodiment. In FIG. 7, a top yoke 16 is fixed via supports 15C, 15D etc., above a bottom yoke 10. A plurality of drive units 60 are arranged at a predetermined pitch in the X direction and the Y direction on the bottom yoke 10, so as to cover the whole face of the moving plane of the wafer table 5, and the wafer table 5 (the bottom thereof is a magnet plate 8) is arranged on the plurality of drive units 60.

Also in this embodiment, a first magnetic circuit comprising the bottom yoke 10, the magnet plate 8 in the wafer table 5, the top yoke 16 and the supports 15C, 15D etc., and a second magnetic circuit where the magnetic flux leaking into space from the bottom face of the magnet plate 8 returns to the magnet plate 8 through the top yoke 16 are formed, and the force for lifting toward the top yoke 16 side acts on the wafer table 5 principally by means of the second magnetic circuit. Moreover, drive units 60 always in about 3 rows×3 columns are arranged at the bottom face of the wafer table 5. The drive units 60 also comprise X coils 27A and 27B for imparting a thrust in the X direction, Y coils 28A and 28B for imparting a thrust in the Y direction and a Z coil 29 for imparting a thrust in the Z direction, each with respect to the magnet plate 8.

FIG. 8 shows a condition with one drive unit 60 in FIG. 7 disassembled. In FIG. 8, inverse U-shaped cores 25A and 25B parallel with the X direction are arranged diagonally on the bottom yoke 10, and inverse U-shaped cores 26A and, 26B parallel with the Y direction are arranged on an opposite diagonal to that of the cores 25A and 25B. Moreover, the drive unit 60 is constructed such that, as shown by the two dot chain lines, the X coils 27A and 27B are wound around the axis parallel with the X axis at the upper part of the cores 25A and 25B, and the Y coils 28A and 28B are wound around the axis parallel with the Y axis at the upper part of the cores 26A and 26B, and as shown by solid lines, the Z coil 29 is wound around the axis parallel with the Z axis so as to surround these cores.

In this embodiment, since for example a magnetic flux BA coming from the upper part of the core 25A heads toward the bottom yoke 10 through an inverse U-shaped route, the magnetic flux is practically non existent on the bottom portion of the X coil 27A. Therefore, if a current IX towards the Y direction is supplied in the upper part of the X coil 27A, a Lorentz force FXA towards the X direction acts on the X coil 27A by means of the current IX and the magnetic flux BA. The case of the other X coil 27B is the same. On the other hand, on the side of the Y coils 28A and 28B, by supplying a current towards the X direction, a Lorentz force towards the Y direction acts. Moreover, in this embodiment, for example in the core 25A, the magnetic flux generated by the X coil 27A forms a closed magnetic circuit comprising the core 25A and the bottom yoke 10, as shown by the route 30, and does not affect the other cores 25B, 26A and 26B. Hence the control precision of the thrust in the X direction and the Y direction is improved.

Next is a description of the operation of the drive unit 60 of this embodiment, with reference to FIG. 9. In FIG. 9, as the drive circuit of the drive unit 60, the drive circuit 31 in FIG. 5 of the first embodiment can be utilized. A Lorentz force is generated in the X direction by means of the current IX flowing through the X coils 27A and 27B and the magnetic flux BA in the Z direction, and a thrust FX in the X direction as the reaction force thereto is generated in the magnetic plate 8 (wafer table 5). Similarly, a Lorentz force is generated in the Y direction by means of the current IY flowing through the Y coils 28A and 28B and the magnetic flux BA in the Z direction, and a thrust FY in the Y direction as the reaction force thereto is generated in the magnetic plate 8. Moreover, by controlling the value of the current IZ supplied to the Z coil 29, a new variable magnetic flux passing through the Z coil 29 is generated, and by means of the variable magnetic flux, a thrust FZ (repulsion or attraction) in the Z direction comprising a reluctance force acts on the magnet plate 8. Therefore, by using a plurality of drive units 60 in combination, the wafer table 5 can be driven with six degrees of freedom as with the first embodiment.

[Third Embodiment]

Next is a description of a third embodiment of the present invention and a modified embodiment thereof with reference to FIG. 14 to FIG. 17. This embodiment also uses a drive unit different from those of the above described embodiments. Similar parts corresponding to those in FIG. 7 to FIG. 9 are denoted by the same reference numerals in FIG. 14 to FIG. 17, and detailed description thereof is omitted.

Figure 14:
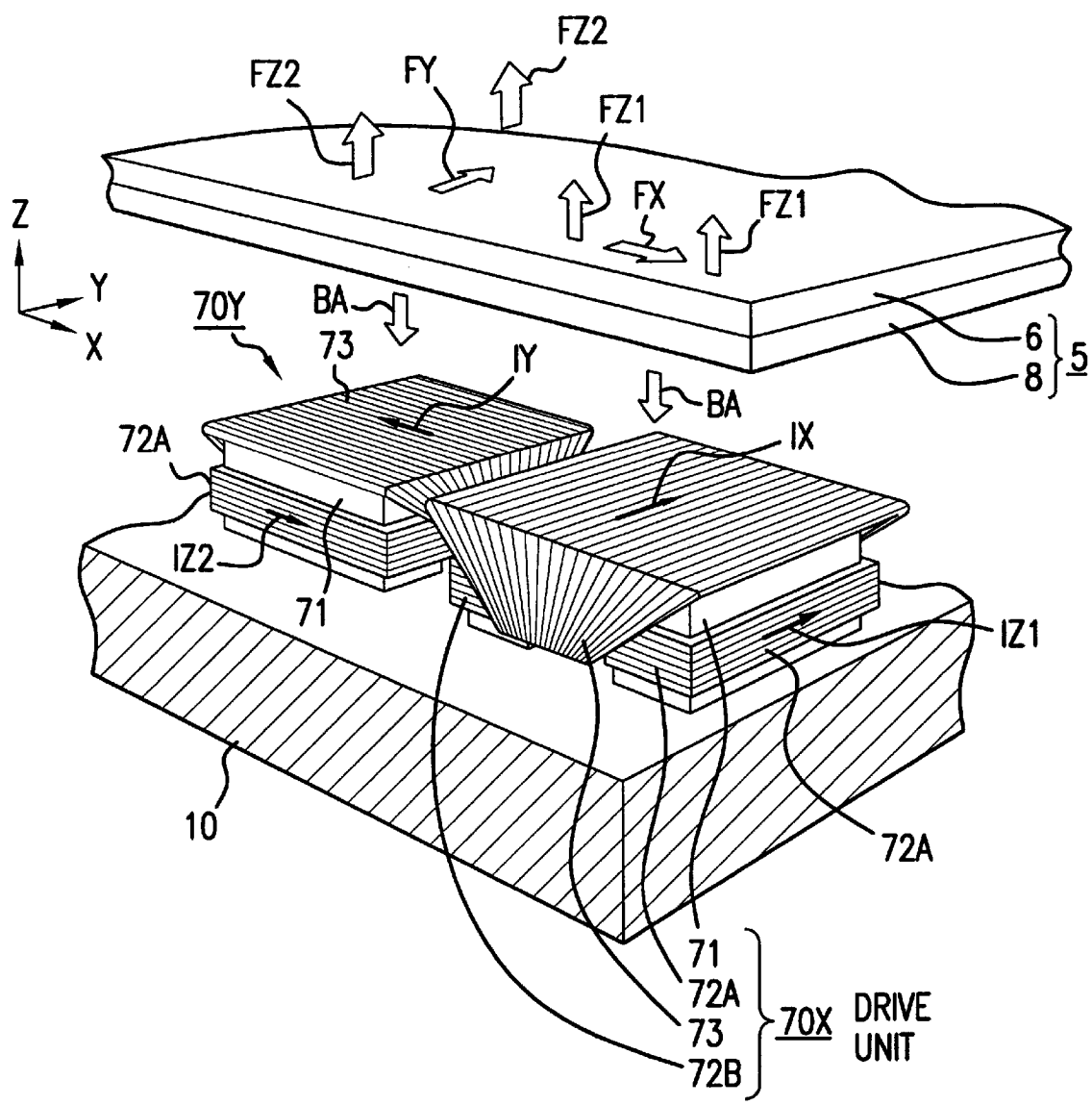
FIG. 14 is a perspective view showing the main parts of a wafer stage of the embodiment of the present invention.

FIG. 14 is a perspective view showing the main parts of the wafer stage side of the projection exposure apparatus of this embodiment. In FIG. 14, a wafer table 5 is arranged so as to be lifted approximately in a magnetic circuit between a bottom yoke 10 and a top yoke 16 (not shown) (see FIG. 7). Two kinds of drive units 70X and 70Y are arranged on the upper face of the bottom yoke 10 alternately at a predetermined pitch in the X direction and the Y direction so as to cover the whole face of the moving plane of the wafer table 5. The X axis drive unit 70X gives variable thrust in the Z direction and in the X direction to the magnet plate 8 in the wafer table 5, and the Y axis drive unit 70Y arranged by the rotating a drive unit 70X through 90°, gives variable thrust in the Z direction and in the Y direction to the magnet plate 8 (and the wafer table 5). Drive units 70X, 70Y always in about 3 rows×3 columns are arranged at the bottom face of the wafer table 5, and an overall variable thrust with six degrees of freedom acts on the wafer table 5 (magnet plate 8) by means of these.

The drive unit 70X comprises; a core 71 comprising a ferromagnetic body in a convex arch-like shape with respect to the magnet plate 8, that is, in an inverse U-shape with two leg portions fixed on the bottom yoke 10, a horizontal coil 73 wound around an axis approximately parallel with the X axis, on an upper part of the core 71 and serving as a bobbin, and two Z coils 72A, 72B wound around axes parallel with the Z axis consisting of two leg portions of the core 71. The horizontal coil 73 of the drive unit 70X corresponds to the X coil, and the horizontal coil 73 of the drive unit 70Y corresponds to the Y coil.

Figure 15:
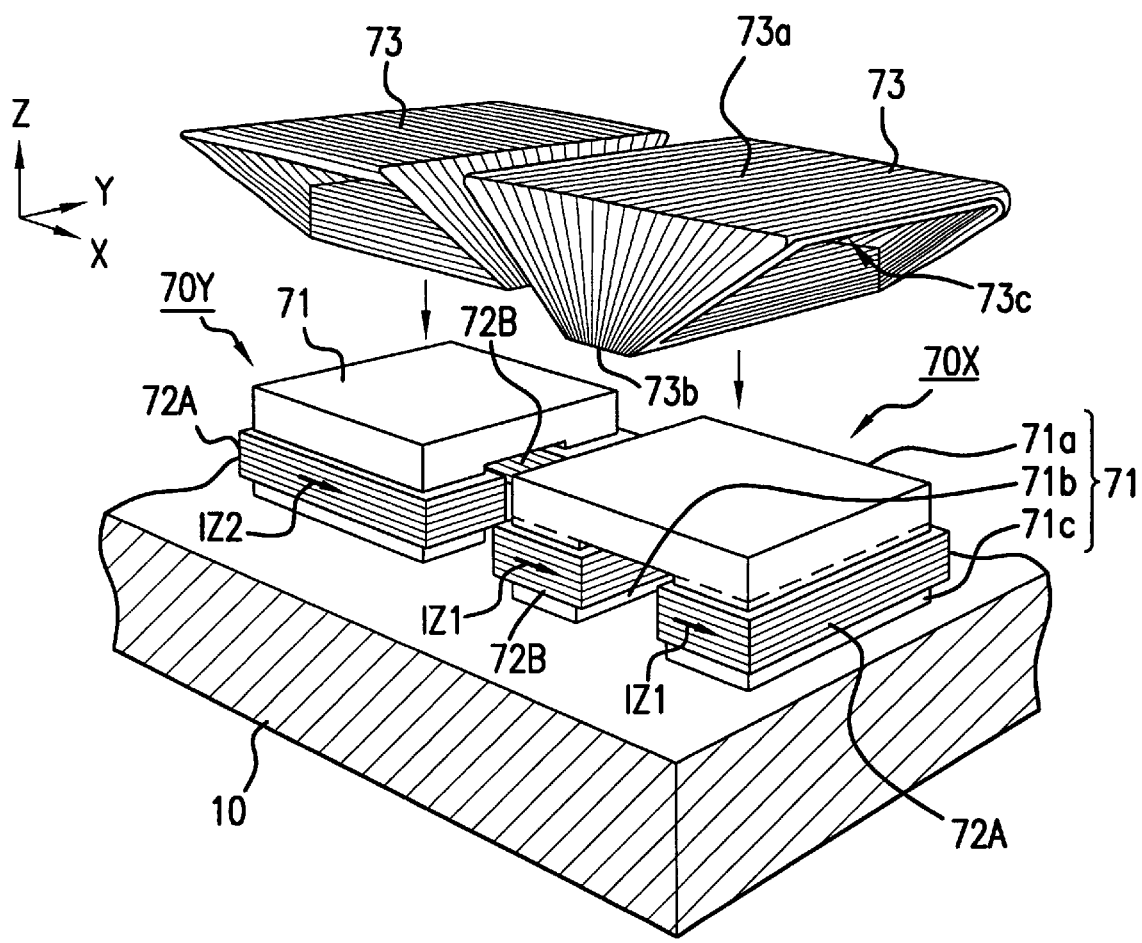
FIG. 15 is an exploded perspective view showing a condition where a part of a coil is removed from the drive units 70X and 70Y in FIG. 14.

FIG. 15 shows a condition where the horizontal coils 73 are separated from the drive units 70X and 70Y respectively. In this FIG. 15, the horizontal coil 73 of the drive unit 70X is wound around an opening 73c into which an upper portion 71a above a dotted line of the core 71 is inserted. The upper portion 73a of the horizontal coil 73 is approximately flat and has an area wider than the upper portion 71a of the core 71, and the coil is narrowed at a lower portion 73b, so that the lower portion 73b can pass between the leg portions 71b and 71c of the core 71.

In this case, as one example, the drive unit 70X may be assembled in such a manner that the leg portions 71b, 71c and the upper portion 71a are formed from three separate bar members, and the horizontal coil 73 is wound using a bar member having the same sectional area as that of the upper portion 71a. Then after inserting the upper portion 71a into the opening 73c of the horizontal coil 73, the leg portions 71c, 71b respectively wound with the Z coils 72A and 72B are bolted to the opposite end portions of the upper portion 71a from beneath. Alternatively, the drive unit 70X may be assembled in such a manner that after thin plates of an L-shaped ferromagnetic body are alternately inserted into the opening 73c of the horizontal coil 73 from the left and the right sides, thin plates of an I-shaped ferromagnetic body are inserted into the spaces in the left and right sides. The other drive unit 70Y can be assembled in the same manner.

In FIG. 15, the leg portions 71b, 71c of the core 71 are directly and magnetically connected to the bottom yoke 10, respectively, but the leg portions 71b and 71c are not directly and magnetically connected with each other. This is to reduce the inductance of each coil 72A, 72B, 73, to thereby improve the response of the thrust.

Moreover, in FIG. 14, on the upper face of the horizontal coil 73 of the drive unit 70X (X coil), the magnetic flux BA in the magnetic circuit including the magnet plate 8, the core 71 and the bottom yoke 10, faces the Z direction (in FIG. 14, −Z direction). If the current IX in the +Y direction is made to flow in the horizontal coil 73, a Lorentz force in the −X direction is generated in the horizontal coil 73, and a thrust FX in the +X direction as the reaction is generated in the wafer table 5 (magnet plate 8). By controlling the direction and the size of the current IX, the direction and the size of the thrust FX with respect to the wafer table 5 can be controlled. Similarly, by controlling the current IY in the X direction supplied to the horizontal coil 73 (Y coil) of the drive unit 70Y, a variable thrust FY in the Y direction can be generated with respect to the wafer table 5. Since the flux density is small in portions other than the upper portion 73a of the horizontal coil 73, a Lorentz force in the reverse direction is barely generated, for example, at the lower portion 73b of the horizontal coil 73 (see FIG. 15). This is because the magnetic flux coming out from the magnet plate 8 flows to the bottom yoke 10 through the core 71 which is a ferromagnetic body.

Moreover, the Z coils 72A and 72B are arranged on the lower side of the horizontal coil 73 and in the vicinity of the junction of the core 71 and the bottom yoke 10. Since the Z coils 72A and 72B substantially surround the entire junction, by flowing a current IZ1 around the Z axis to the Z coils 72A and 72B of the drive unit 70X, a magnetomotive force can be given to the entire core 71. Therefore, a relatively linear thrust FZ1 in the Z direction can be given to the wafer table 5 (magnet plate 8). Furthermore, by controlling the current IZ2 flowing in the Z coils 72A and 72B of the other drive unit 70Y to control the thrust FZ2 in the Z direction with respect to the wafer table 5, leveling of the wafer table 5 can be performed.

Moreover, with this embodiment, when it is attempted to flow the current IX in the horizontal coil 73 of, for example the drive unit 70X, an electromotive force which attempts to flow the current in the reverse direction is generated. That is, a magnetic flux passing through the closed magnetic circuit comprising the core 71 and the bottom yoke 10 is generated. Hence there is a possibility that the thrust FX with respect to the wafer table 5 becomes small. To prevent the decrease of the thrust FX, a current may be made to flow with respect to the Z coils 72A and 72B in the reverse direction to each other so as to be superimposed on the current IZ1 and to generate a magnetic flux for offsetting the magnetic flux. In this way, the thrust FX in the X direction with respect to the wafer table 5 (same with the thrust FY) can be controlled to a desired value.

A modified embodiment of the drive unit of the third embodiment described above for reducing the electromotive force which attempts to flow the current in the reverse direction with respect to the horizontal coil 73 will be described with reference to FIG. 16 and FIG. 17.

Figure 16:
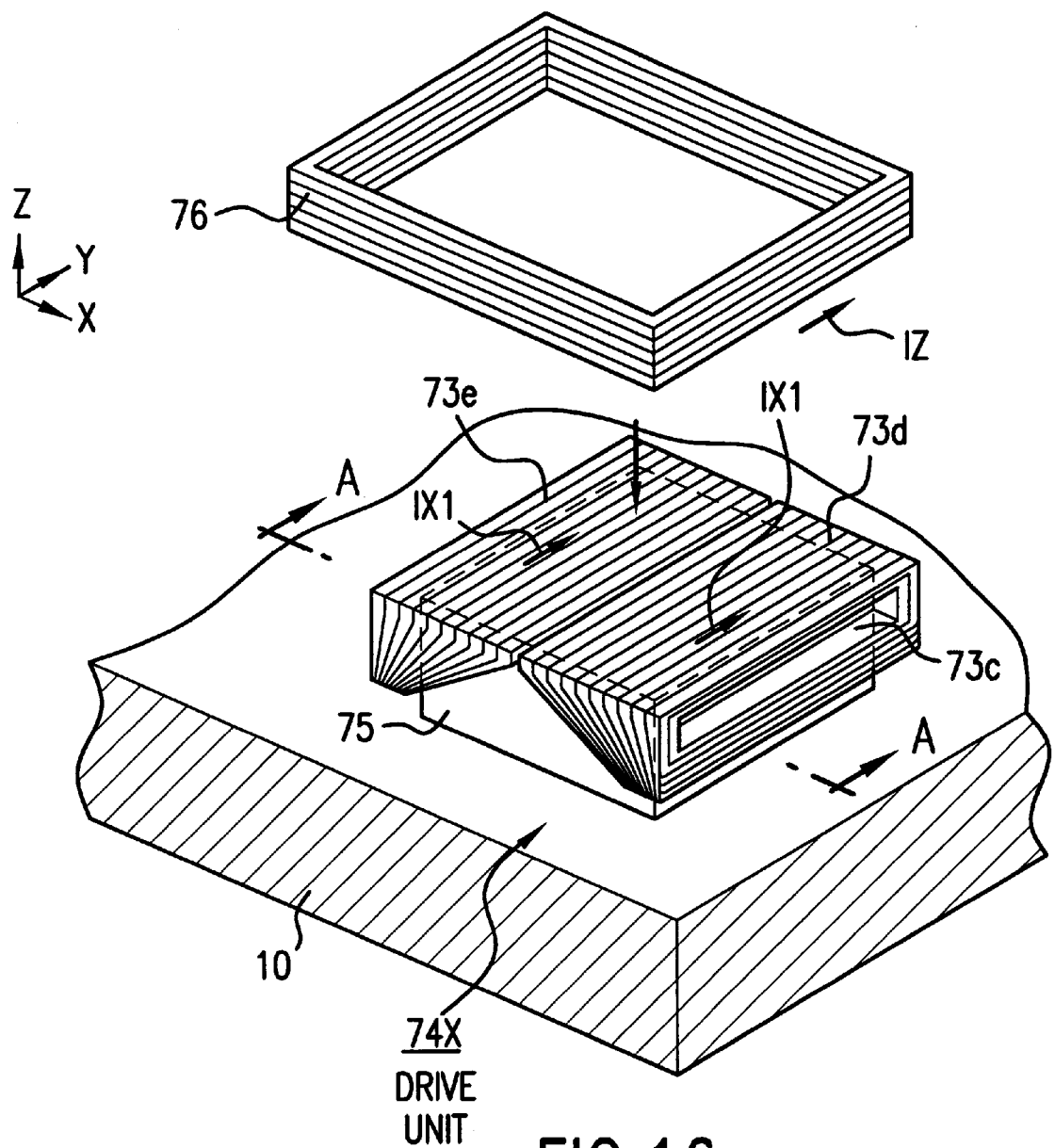
FIG. 16 is an exploded perspective view showing a condition where a part of a coil is removed from a drive unit according to the embodiment.

FIG. 16 shows a disassembled condition of one X axis drive unit 74X of this modified embodiment. In this FIG. 16, a core 75 comprising a rectangular, thick and flat ferromagnetic body is fixed on the bottom yoke 10, and a pair of horizontal coils 73d and 73e each wound around an axis (opening 73c) parallel with the X axis, are mounted so as to have an upper portion of the core 75 between them in the X direction. The horizontal coils 73d and 73e are respectively equivalent to half coils in the -X direction and +X direction, in the case where the horizontal coil 73 in FIG. 14 is divided into half symmetrically on a plane parallel with the ZY plane. The drive unit 74X is constructed by mounting a Z coil 76 wound in a rectangular frame form around the Z axis, so as to surround the core 75 and the horizontal coils 73d and 73e.

Figure 17:
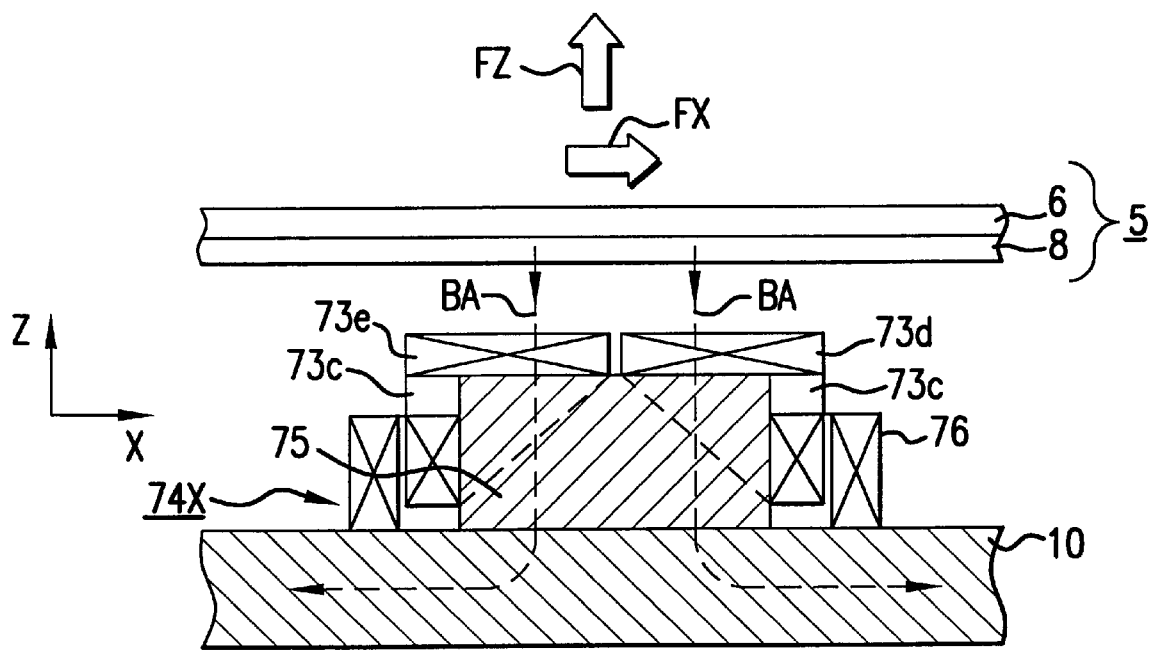
FIG. 17 is a sectional view along the line AA in FIG. 16, showing the assembled condition of the drive unit according to the embodiment.

FIG. 17 is a sectional view along the line AA in FIG. 16, showing the condition where the wafer table 5 is located on the drive unit 74X. In FIG. 17, a magnetic flux BA passes the horizontal coils 73d and 73e on the upper face of the core 75 in the Z direction by means of the magnetic circuit including the magnet plate 8 of the wafer table 5, the core 75, and the bottom yoke 10. Therefore, by making a current IX1 flow through the horizontal coils 73d and 73e in the Y direction (see FIG. 16), a variable thrust FX in the X direction is generated as the reaction to the Lorentz force generated in the horizontal coils 73d, 73e, in the magnet plate 8 (wafer table 5). Moreover, by making a current IZ around the axis parallel with the Z axis flow through the Z coil 76, the magnetic flux passing through the entire core 75 changes, and a variable thrust FZ in the Z direction which changes approximately linearly is generated with respect to the magnet plate 8 (wafer table 5).

With this modified embodiment, when the current IX1 is supplied to the horizontal coils 73d, 73e, the electromotive force (magnetic flux) in a direction negating the current IX1 is not generated in the core 75. Hence it is necessary to supply only the current corresponding to the thrust FZ in the Z direction, to the Z coil 76. Moreover, the core 76 is not saturated.

[Fourth Embodiment]

Figure 10:
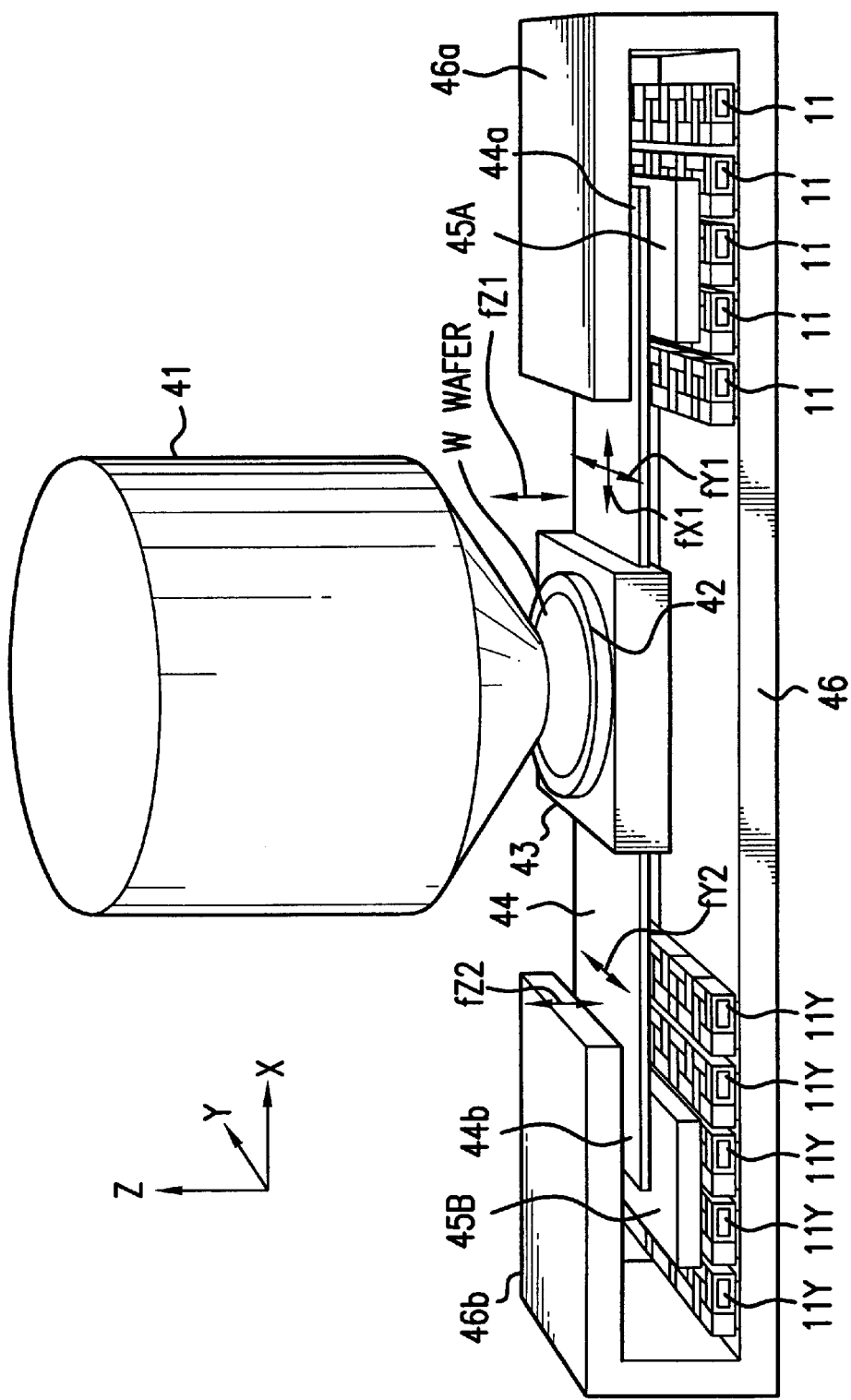
FIG. 10 is a perspective view showing a projection exposure apparatus of the other embodiment of the present invention.
Figure 11:
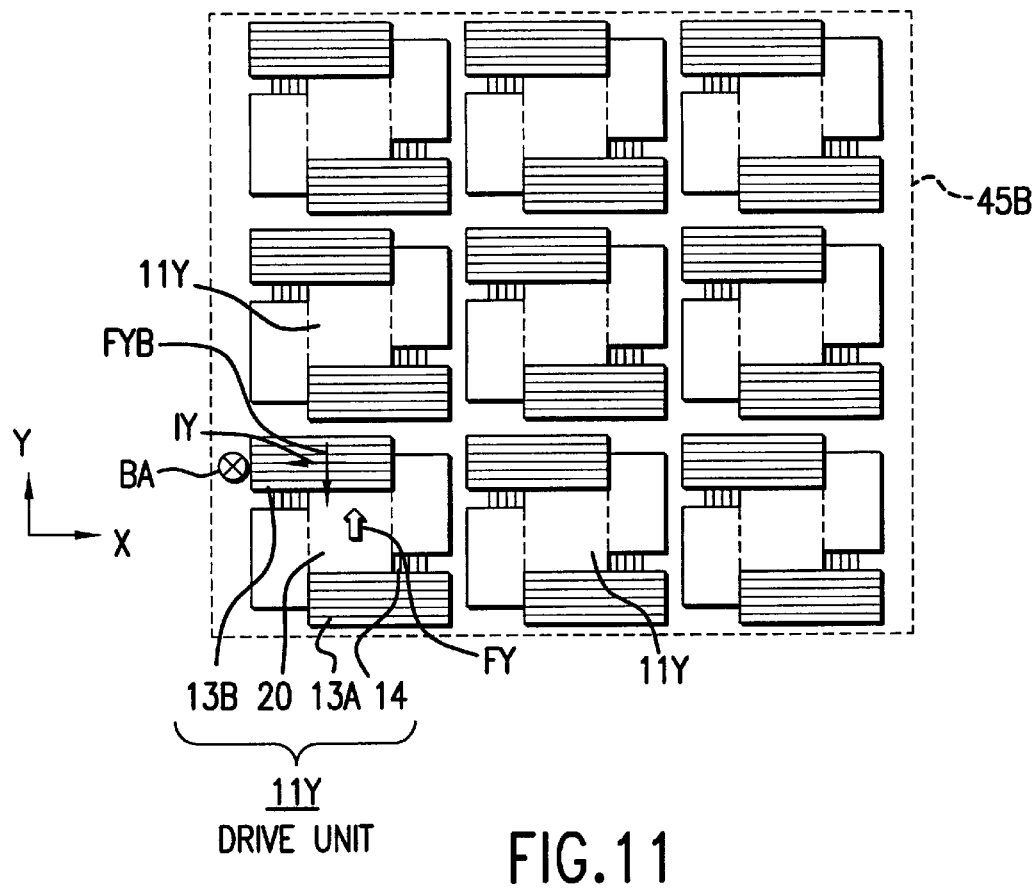
FIG. 11 is a plan view showing the drive units 11Y on the bottom face side of the magnet plate 45B in FIG. 10.

Next is a description of a fourth embodiment of the present invention with reference to FIG. 10 and FIG. 11. With for example the embodiment shown in FIG. 1 and FIG. 2, since the wafer W moves in a magnetic flux, it tends to be difficult to apply the positioning apparatus to a positioning apparatus which uses charged particle beams to transfer a mask pattern, for example an electron beam transfer apparatus. Therefore, in this embodiment is shown an example of a positioning apparatus which can also be used for an electron beam transfer apparatus, by constructing so that the wafer does not have to pass through the magnetic flux.

FIG. 10 shows the main part of the projection exposure apparatus of this embodiment. In FIG. 10, a mask pattern (not shown) is transferred to a wafer W via a projection optical system 41. As the projection optical system 41, other than an optical type projection optical system which projects a pattern image based on ultraviolet radiation such as an excimer laser beam, an electron optical system or the like which transfers a reduced size image of the mask pattern based on an electron beam can be used. Below is a description taking the Z axis in the direction of the optical axis of the projection optical system 41, and designating the rectangular coordinate system in the plane perpendicular to the Z axis as the X axis and the Y axis.

At this time, the wafer W is suction attached and held on a wafer holder 42, and the wafer holder 42 is fixed on a specimen support 43. The specimen support 43 is fixed on a central portion of a movable plate 44 of an elongate non-magnetic material approximately along the X axis. Rectangular plate-like magnet plates 45A and 45B which generate uniform magnetic fluxes towards for the Z direction are respectively fixed on the bottom face of the +X direction end portion 44a and the -X direction end portion 44b of the movable plate 44. The magnet plates 45A and 45B are each a permanent magnet with, for example, the bottom face being the N-pole and the upper face being the S-pole. Moreover, a yoke plate 46 comprising a ferromagnetic body is arranged on the bottom side of the movable plate 44, and opposite end portions 46a and 46b of the yoke plate 46 are respectively formed in a letter "U" shape so as to have the magnet plates 45A and 45B at the opposite end portions of the movable plate 44, between upper and lower portions thereof.

Between the +X direction side magnet plate 45A and the yoke plate 46 are disposed multiple drive units 11 in the X direction and the Y direction at a predetermined pitch so as to cover the moving range of the magnet plate 45A. Moreover between the -X direction side magnet plate 45B and the yoke plate 46 are disposed multiple drive units 11Y in the X direction and the Y direction at a predetermined pitch so as to cover the moving range of the magnet plate 45B. The drive units 11 on the +X direction side have the same construction as that of the drive units 11 in the first embodiment shown in FIG. 5. In FIG. 10, the lifting force is imparted to the +X direction side magnet plate 45A at the center of the yoke plate 46, and a thrust fX1 in the X direction, a thrust fY1 in the Y direction and a thrust fZ1 in the Z direction act on the magnet plate 45A from the plurality of drive units 11. By controlling these thrust, the magnet plate 45A, and consequently the +X direction side end portion 44a of the movable plate 44 is positioned in the X direction, the Y direction and the Z direction in a non-contact state.

On the other hand, the drive units 11Y on the −X direction side are different from the drive unit 11 in the first embodiment, being drive units for generating only a thrust in the Y direction and in the Z direction.

FIG. 11 shows the condition at the bottom face of the −X direction side magnet plate 45B in FIG. 10. In FIG. 11, at the bottom face side of the magnet plate 45B, there is always accommodated for example, about 3 rows×3 columns of drive units 11Y. One drive unit 11Y is constructed with respect to the core 20 shown in FIG. 4, by winding the Y coils 13A, 13B around only a pair of flange portions (flange portions 20d, 20e in FIG. 4) in the Y direction, and winding the Z coil 14 so as to surround the bottom portion of the core 20. If the current IY is supplied to, for example the Y coil 13B in the X direction, a Lorentz force FYB in the Y direction acts on the Y coil 13B, by means of the magnetic flux BA which comes in from the upper face of the core 20 and is bent inward at the flange portion. Similarly, a Lorentz force in the Y direction acts on the other Y coil 13A. As the reaction to the Lorentz force, a thrust in the Y direction is generated in the magnet plate 45B above these coils. Furthermore, by supplying the current to the Z coil 14, a thrust in the Z direction is generated in the magnet plate 45B above the coil. As a result, the drive unit 11Y can impart a variable thrust in the Y direction and the Z direction to the magnet plate 45B above the drive unit in a non-contact state.

Returning to FIG. 10, the lifting force is imparted to the −X direction side magnet plate 45B in the yoke plate 46, and the thrust fY2 in the Y direction and the thrust fz2 in the Z direction act on the magnet plate 45B from the plurality of drive units 11Y. By controlling these thrusts, the magnet plate 45B, and consequently the −X direction side end portion 44b of the movable plate 44 is positioned in the Y direction and the Z direction in a non-contact state. Displacement of the end portion 44b in the Y direction means that the movable plate 44 is rotated around the axis parallel with the Z axis. Moreover, by controlling the thrust in the Z direction by means of the three or more drive units 11, 11Y at the bottom face of the magnet plates 45A and 45B, the position in the Z direction, the angle of inclination around the X axis, and the angle of inclination around the Y axis of the movable plate 44 can be controlled, and as a result, the wafer W on the specimen support 43 fixed on the movable plate 44 can be positioned with six degrees of freedom.

In this case, the yoke plate 46 of this embodiment has a construction for connecting the yoke plates in the letter "U" shape on the left and right sides. Hence leakage of the magnetic flux to the central portion of the movable plate 44, that is, to the wafer W side becomes very slight. Therefore, the positioning section in this embodiment can also be used as a wafer stage for an electron beam transfer apparatus or the like. Moreover, also in this embodiment, the drive units 11 and 11Y may be disposed respectively at the upper face side of the magnet plates 45A and 45B, or may be disposed at both the upper face and the bottom face sides of the magnet plates 45A and 45B. Furthermore, with this embodiment, a core, an X coil, a Y coil and a Z coil are provided in the drive unit 11, and a core, a Y coil and a Z coil are provided in the drive unit 11Y. However, the construction may be such that, for example, four drive units are provided, with two drive units of these comprising only a Z coil, one drive unit comprising a core, an X coil and a Y coil, and the remaining one drive unit comprising a core and only a Y coil.

[Fifth Embodiment]

Figure 12:
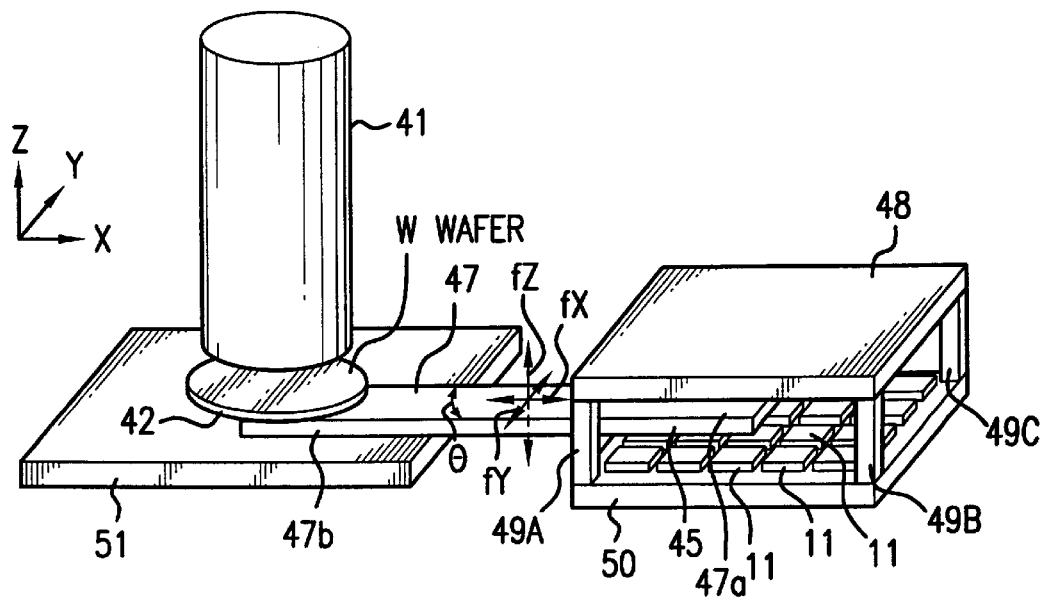
FIG. 12 is a perspective view showing a projection exposure apparatus of an other embodiment of the present invention.

Next is a description of a fifth embodiment of the present invention with reference to FIG. 12. This embodiment is also an example of a positioning apparatus applicable to a charged particles beam transfer apparatus, where the magnetic flux does not act on the wafer W, being the object to be positioned. In FIG. 12, similar parts corresponding to those in FIG. 10 are denoted by the same reference numerals, and detailed description thereof is omitted.

FIG. 12 shows the main parts of the projection exposure apparatus of this embodiment. In FIG. 12, a mask pattern (not shown) is transferred to a wafer W via a projection optical system 41. The wafer W is suction attached and held on a wafer holder 42, and the wafer holder 42 is fixed on an −X direction end portion 47b of a movable plate 47 of an elongate non-magnetic material approximately along the X axis. At the bottom face of the end portion 47b where the wafer W is mounted, a base 51 on which the end portion 47b can be mounted at any time is arranged at a predetermined spacing.

A rectangular plate-like magnet plate 45 which generates a uniform magnetic flux toward the Z direction is fixed on the bottom face of the +X direction end portion 47a of the movable plate 47. The magnet plate 45 is a permanent magnet with, for example the bottom face being the N-pole and the upper face being the S-pole. Moreover, a yoke member obtained by connecting a yoke plate 50, four supports 49A to 49D (in FIG. 12, only 49A to 49C can be seen) and a top yoke 48, is arranged so as to have the magnet plate 45 at the end portion of the movable plate 47 between the upper and lower portions thereof, and to cover the whole face of the moving range of the magnet plate 45. Multiple drive units 11 are disposed in the X direction and the Y direction at a predetermined pitch on the upper face of the bottom yoke 50 at the bottom of beneath the magnet plate 45. The drive units 11 have the same construction as that of the drive units 11 in the first embodiment shown in FIG. 5. In FIG. 12, the lifting force is imparted to the magnet plate 45 in the yoke member, and the thrust fX in the X direction, the thrust fY in the Y direction, the thrust fZ in the Z direction, the torque in the θ direction around the Z axis, the torque around the X axis, and the torque around the Y axis can be imparted to the magnet plate 45 from the plurality of drive units 11. By controlling these thrusts and torques, the magnet plate 45, and consequently the wafer W on the end portion of the movable plate 47 are positioned with six degrees of freedom by a cantilever systems.

Also in this embodiment, the part in the magnetic flux is only the +X direction end portion 47a of the movable plate 47, and the magnetic flux barely acts on the wafer W. Hence this positioning apparatus can also be used for the wafer stage of an electron beam transfer apparatus or the like.

In the above embodiments, the magnet plate 8 has a monopolar construction. However, the table can be similarly positioned also with a multipolar construction.

Figure 13:
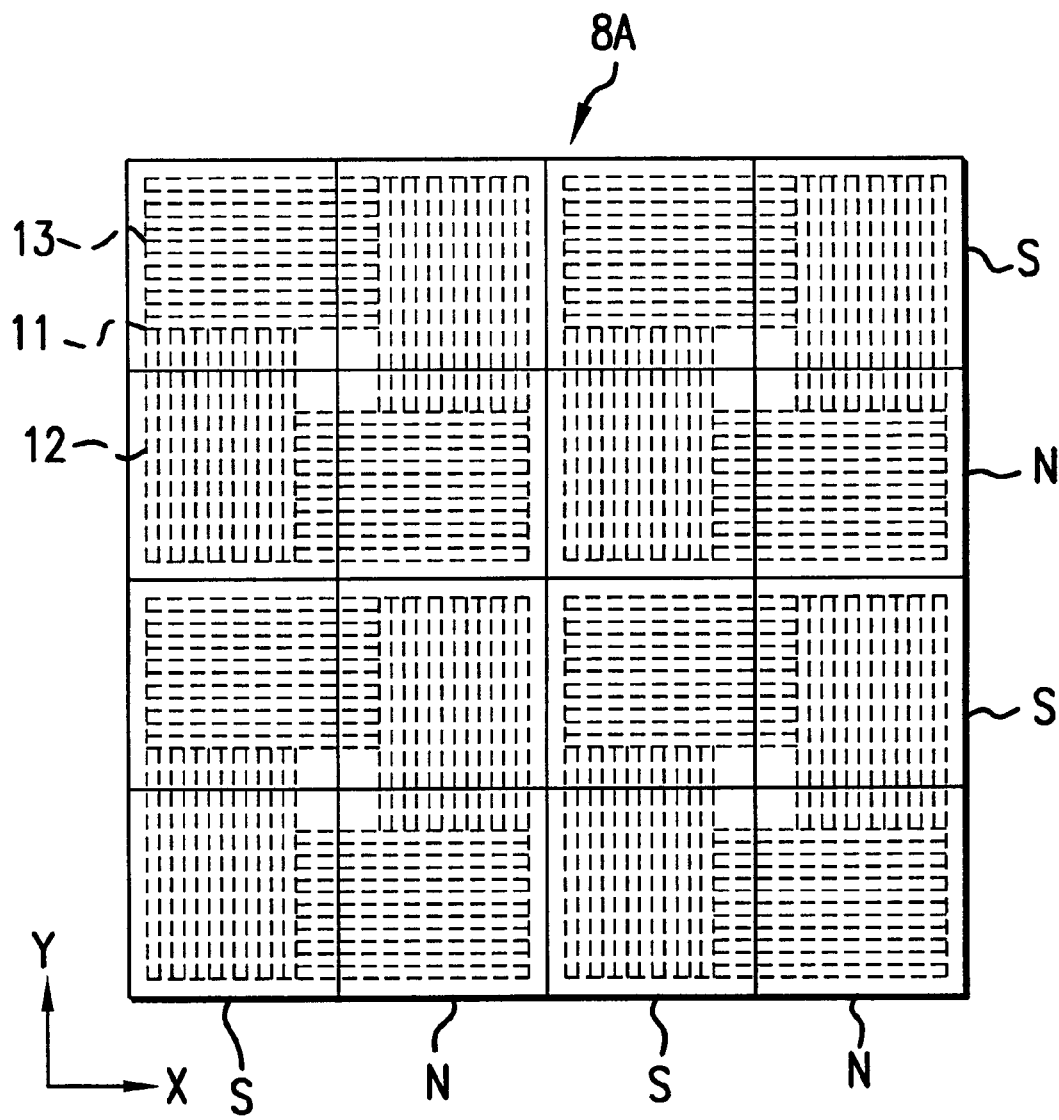
FIG. 13 is a plan view showing a case where a multipolar magnet plate is used in the embodiment of the present invention.

FIG. 13 shows a plan view of one example of a multipolar magnet plate 8A. In FIG. 13, as shown by the dotted lines at the bottom face side of a magnet plate 8A, a plurality of drive units 11 (the same as those shown in FIG. 2) are arranged in the X direction and the Y direction at a predetermined pitch. The magnet plate 8A is formed from an array of rectangular plate-like small magnet plates in 4 rows×4 columns. The polarity of these small magnet plates are reversed alternately both in the X direction and in the Y direction. Moreover, small magnet plates in 2 rows×2 columns (the ones on the same diagonal have the same polarity, and the ones on the intersecting diagonal have a different polarity to these) in the magnet plate 8A are arranged with respect to one drive unit, and when the magnet plate having the N-pole (or the S-pole) on the bottom face faces the X coil 12, the magnet plate having the S-pole (or the N-pole) on the bottom face faces the Y coil 13. Therefore, by only reversing the polarity of the current flowing in the X coil 12 or in the Y coil 13, the magnet plate 8A can be driven in a similar manner to in the above embodiments.

In FIG. 13, a part of the X coil 12 and the Y coil 13 are placed at a magnet plate having a different polarity. However, since this part is the portion where the coil is bent in the Z direction, it does not contribute to the thrust in the X direction and in the Y direction. Moreover, when a multipolar magnet plate 8A is used in this manner, it must be determined to which coil the current should be made to flow according to the position of the magnet plate 8A. Hence the control tends to become complicated.

[Sixth Embodiment]

Next is a description of a sixth embodiment of the present invention with reference to FIG. 18 to FIG. 22. This embodiment also uses a drive unit different from that of the first embodiment. Similar parts corresponding to those in FIG. 1 and FIG. 2 are denoted by the same reference numerals in FIG. 18 to FIG. 22, and detailed description thereof is omitted.

Figure 18:
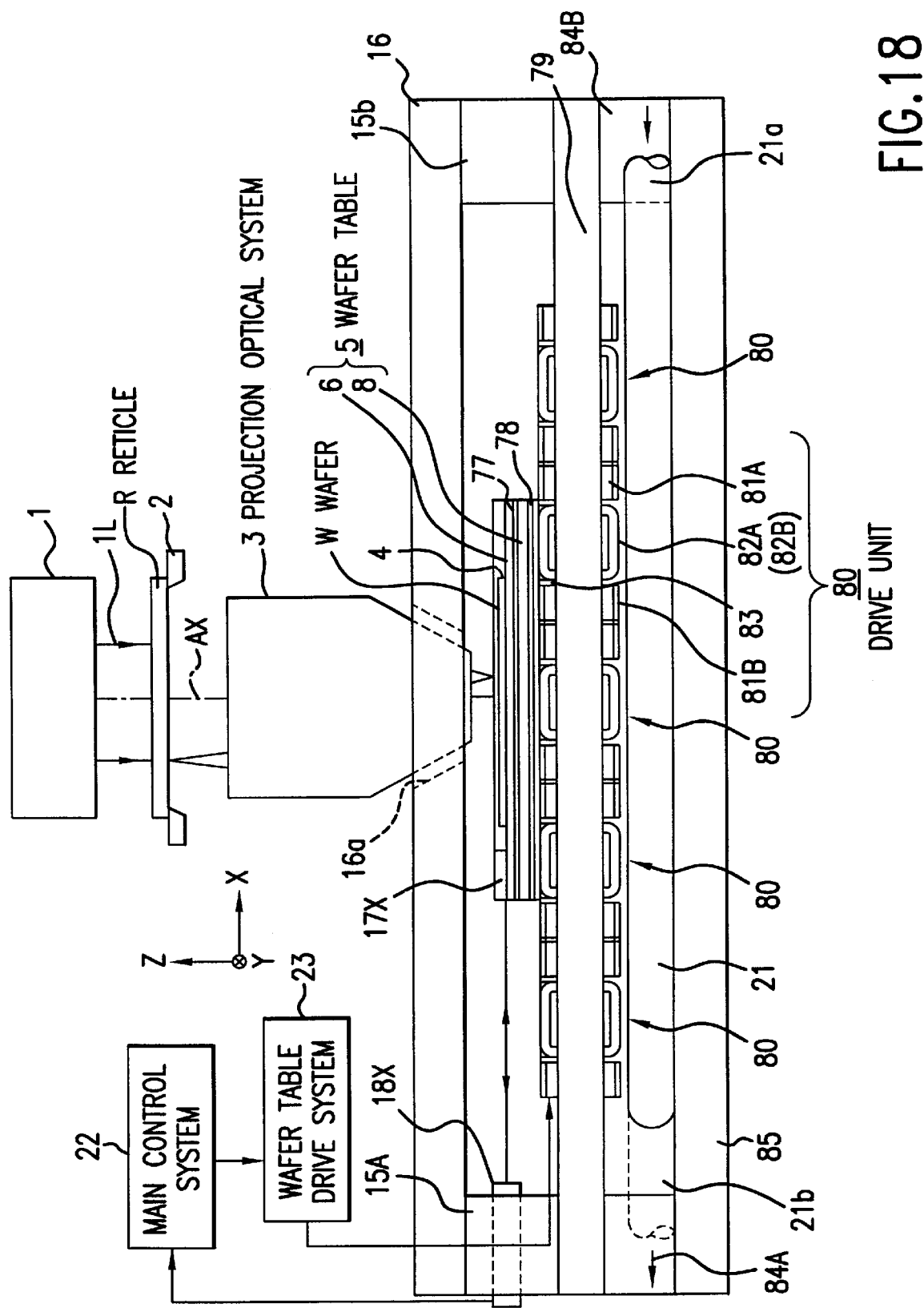
FIG. 18 is a schematic structural diagram showing one example where a magnetic core of a coil constitutes a part of a magnetic member in the embodiment of the present invention.

FIG. 18 is a schematic structural diagram showing a projection exposure apparatus of this embodiment. Laminated on a table 5 in order from the wafer holder side are, a plate 6 made of ceramic, a thin plate 77 comprising a ferromagnetic body as a material having high magnetic permeability, one magnet plate 8 which generates a magnetic flux uniformly in the Z direction, and a thin plate 78 comprising a ferromagnetic body. The thin plate 77 on the upper face of the magnet plate 8 is thicker than the thin plate 78 on the bottom face. These are, as described later, for generating a steady state magnetic lifting force, balanced with the deadweight in the +Z direction, with respect to the wafer table 5. Furthermore, the thin plates 77 and 78 play a role in increasing the thrust with respect to the wafer table 5 (magnet plate 8).

That is to say, a core plate 79 comprising a core (iron core) as multiple magnetic cores is arranged at the bottom face side of the wafer table 5, and multiple drive units 80 are mounted on the core plate 79. Each drive unit 80 comprises; a core, X coils 81A and 81B for imparting a thrust in the X direction to the magnet plate 8 (wafer table 5), Y coils 82A and 82B for imparting a thrust in the Y direction to the magnet plate 8 (wafer table 5), and a Z coil 83 for generating a magnetic flux in the Z direction. A drive circuit of each drive unit 80 is incorporated in a wafer table drive system 23.

The core plate 79 and a top yoke 16 are connected by supports 15A to 15D (in FIG. 18, only 15A and 15B can be seen) comprising ferromagnetic bodies at four corners, and the core plate 79, the magnet plate 8, the top yoke 16 and the supports 15A, 15B and the like form a closed magnetic circuit. Moreover, since the ferromagnetic thin plate 77 on the upper face of the magnet plate 8 is thicker than the ferromagnetic thin plate 78 on the bottom face, then in the state with the drive unit 80 not being operated, a force for lifting in the direction of attraction to the top yoke 16 side acts on the magnet plate 8 between the core plate 79 and the top yoke 16. By actually generating a thrust for attracting the magnet plate 8 toward the core plate 79 side by means of the drive unit 80, the magnet plate 8 (wafer table 5) is stably supported in a floating state at a desired position in the Z direction.

Moreover, a base plate 85 comprising a non-magnetic material is installed via supports 84A and 84B on the bottom face side of the core plate 79, and a tortuous cooling pipe 21 as a cooling apparatus is arranged at the bottom face of the multiple drive units 80 on the base plate 85. A refrigerant comprising a low temperature liquid is fed from a refrigerant feeder (not shown) to an inlet 21a of the cooling pipe 21, and the refrigerant which has flowed in the cooling pipe 21 and which has absorbed heat generated from multiple drive units 11 is returned to the refrigerant feeder from an outlet 21b. Also in this embodiment, since the slight amount of heat generated is carried to the outside by the cooling pipe 21, the increase in the temperature of the wafer table 5 is small, and positioning is performed with high precision.

Furthermore, in this embodiment, the main control system 22 performs positioning of the wafer table 5 (wafer W) by controlling the thrust by means of multiple drive units 80 arranged at the bottom face of the wafer table 5 via the wafer table drive system 23, based on measurements of the X-coordinate and Y-coordinate and the rotation angle of the wafer table 5 (wafer W) by means of laser interferometers 18X, 18Y1, 18Y2, and respectively corresponding movable mirrors 17X and 17Y.

As described above, to the magnet plate 8 of the wafer table 5 in this embodiment, the thrust in the X direction, the Y direction and the Z direction is imparted by means of the multiple drive units 80 at the bottom face thereof. Below is a detailed description of the construction and operation of the drive units 80.

Figure 19:
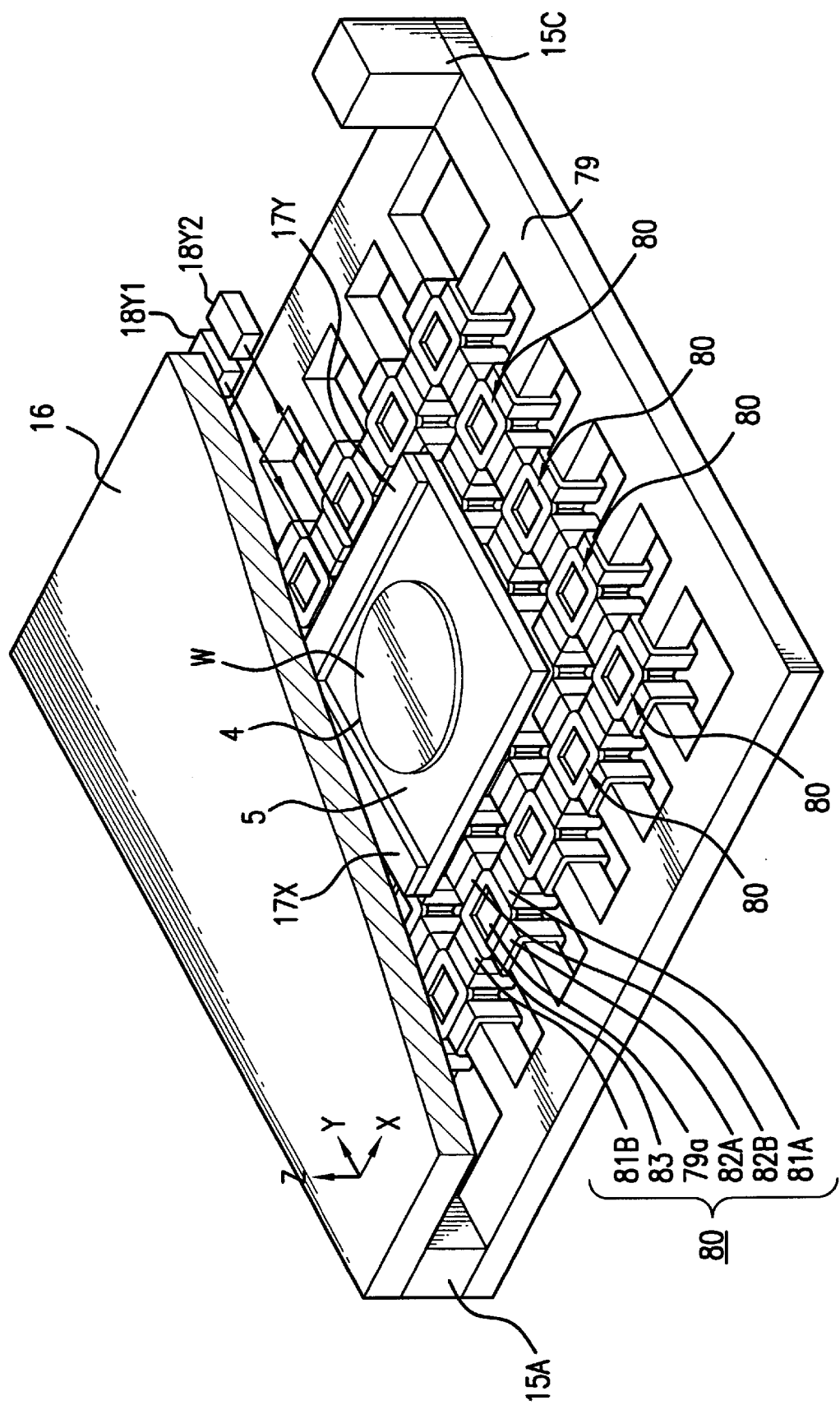
FIG. 19 is a partially cutaway perspective view of FIG. 18 showing the construction from a top yoke 16 to a core plate 79 in FIG. 18.

FIG. 19 is a perspective view of FIG. 18 with the top yoke 16 partially cutaway. As shown in FIG. 19, multiple drive units 80 (in this example, in 5 rows×5 columns) having the same construction are incorporated in the X direction and the Y direction at a predetermined pitch in the core plate 79 so as to cover the whole region where the wafer table 5 (wafer W) moves. In this case, the array pitch of the drive units 80 is so set that the drive units 80 are always collectively arranged in at least 3 rows×3 columns at the bottom face of the wafer table 5.

Figure 20:
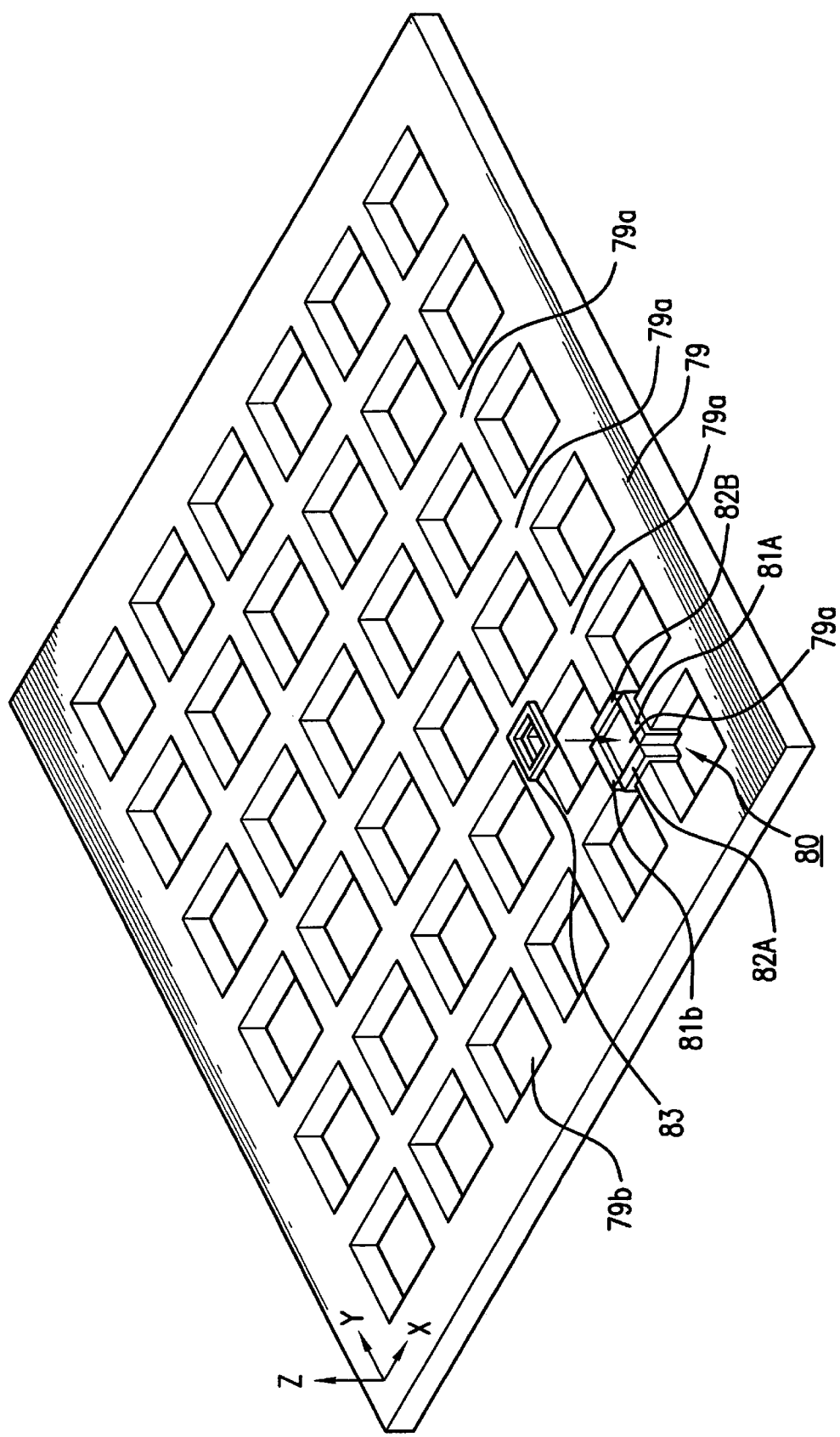
FIG. 20 is a perspective view showing a condition where drive units other than one drive unit 80 are removed from the core plate 79 in FIG. 19.

FIG. 20 shows the core plate 79 in the state where all the drive units except one drive unit 80 are removed from the core plate 79 in FIG. 19. In FIG. 20, the core plate 79 is one in which square through holes 79b are formed in the X direction and in the Y direction at a predetermined pitch on a ferromagnetic flat board. The portions surrounded by four through holes 79b respectively form cruciform cores 79a. With one cruciform core 79a, a pair of X coils 81A and 81B are wound around an axis parallel with the X axis so as to have the cross of the core 79a between them, a pair of Y coils 82A and 82B are wound around an axis parallel with the Y axis so as to have the cross of the core 79a between them, and a Z coil 83 wound around an axis parallel with the Z axis is adhered to an upper face of the cross of the core 79a, thereby forming one drive unit.

Returning to FIG. 19, the other drive units 80 are constructed by respectively mounting the X coils 81A and 81B, the Y coils 82A and 82B, and the Z coil 83 on the cruciform cores 79a, in a similar manner to the drive unit 80 in FIG.

20. Next is a description of the drive unit 80, the construction of the drive unit, and the operation of the drive unit 80, with reference to FIG. 21.

Figure 21:
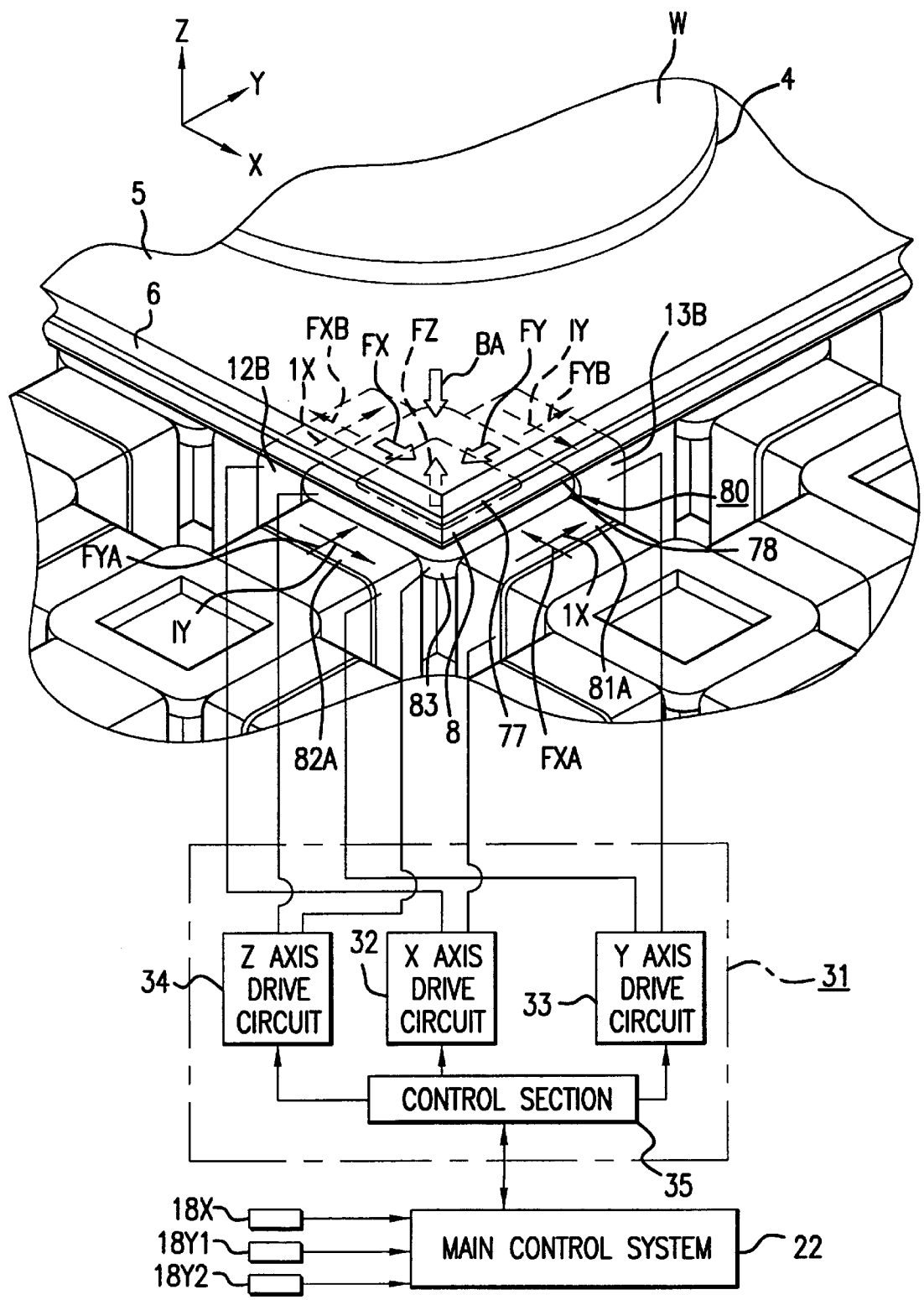
FIG. 21 is a diagram used for the explanation of a drive circuit of the drive unit 80 in FIG. 19 and the operation of the drive unit 80.

FIG. 21 is an enlarged view of a part of FIG. 19. In FIG. 21, attention is given to one drive unit 80 located at the bottom face of the wafer table 5. In this case, the magnetic flux BA going, for example in the −Z direction from the magnet plate 8 to the drive unit 80 is generated by means of the magnet plate 8 in the wafer table 5, and the core plate 79, the top yoke 16 and the like in FIG. 19.

Similar to the arrangement shown in FIG. 5, each drive unit 80 is respectively connected to a drive circuit 31, and a control section 35 in the drive circuit 31 controls the operation of each circuit under the instruction from the main control system 22. Therefore, by controlling the current to the X coils 81A and 81B, the Y coils 82A and 82B, and the Z coil 83 by means of an X-axis drive circuit 32, a Y-axis drive circuit 33 and a Z-axis drive circuit 34 in the drive circuit 31, and by combining the thrusts FX, FY and FZ in the X direction, the Y direction and the Z direction on the magnet plate 8 (wafer table 5), the wafer table 5 can be positioned with six degrees of freedom (displacement in the X direction, Y direction and Z direction, and rotation around the X axis, Y axis and Z axis).

Figure 22A:
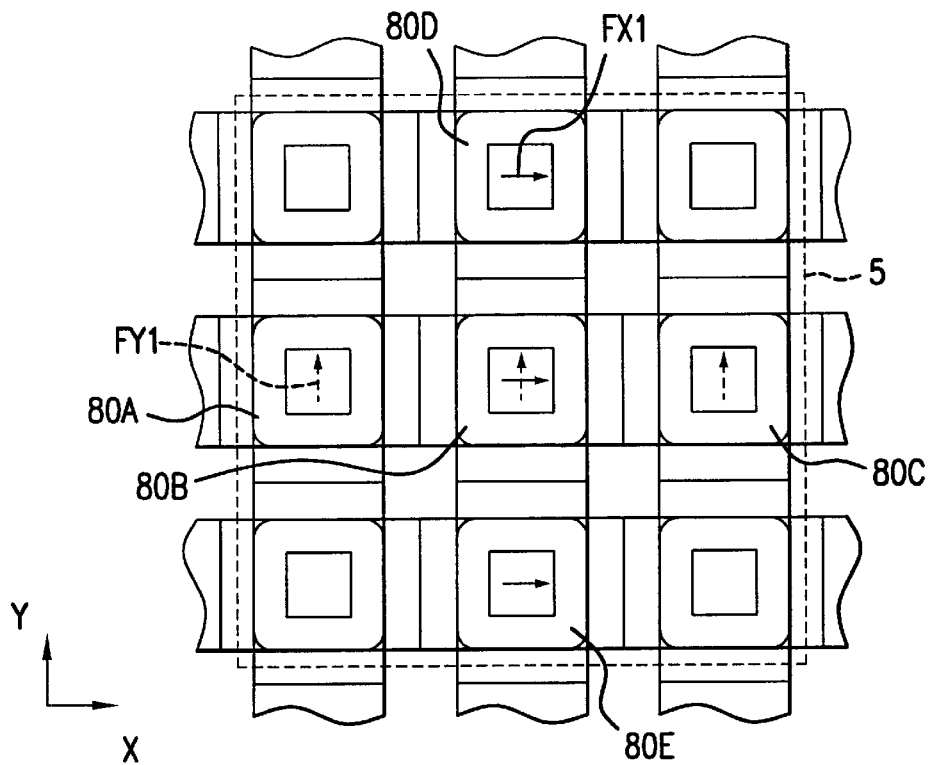
FIG. 22(a) is a plan view for the case of driving a wafer table 5 in the X direction and the Y direction using a plurality of the drive units 80 in FIG. 19.
Figure 22B:
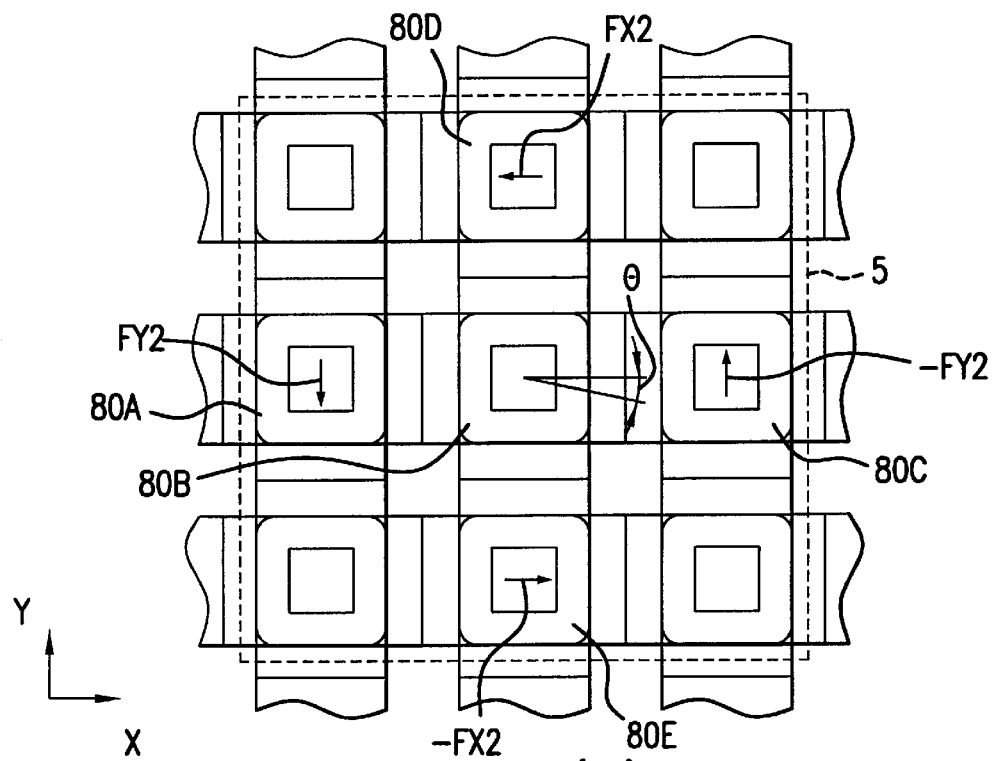
FIG. 22(b) is a plan view for the case of rotation thereof.

Specifically, when the wafer table 5 (wafer W) is displaced in the Y direction, as shown in FIG. 22(*a*) the main control system 22 gives an instruction to generate thrusts FY1 in the Y direction to the control sections of the plurality of drive units 80A, 80B and 80C at the bottom face of the wafer table 5. According to this, the thrusts FY1 in the Y direction act on the wafer table 5 from the drive units 80A to 80C, to thereby displace the wafer table 5 in the Y direction. Similarly, when the wafer table 5 is to be displaced in the X direction, the thrusts FX1 in the X direction can be made to act on the wafer table 5 from the plurality of drive units 80D, 80B and 80E at the bottom face of the wafer table 5.

As shown in FIG. 22(*b*), when a rotation error θ occurs in the wafer table 5 (wafer W), the thrust FY2 in the −Y direction and the thrust −FY2 in the +Y direction are generated respectively from a pair of drive units 80A and 80C separated in the X direction at the bottom of the wafer table 5, and the thrust FX2 in the −X direction and the thrust −FX2 in the +X direction are generated respectively from a pair of drive units 80D and 80E separated in the Y direction, to thereby rotate the wafer table 5 so as to offset the rotation error θ. At this time, since the rotation angle of the wafer table 5 is monitored from the measurements of the laser interferometers 18Y1 and 18Y2 in FIG. 19, the rotation angle of the wafer table 5 can be accurately corrected with a closed loop based on the measurements.

As described above, with this embodiment, since the wafer table 5 on which the wafer W is mounted is driven in a non-contact state, the wafer W can be positioned at a high speed.

Furthermore, with the above described embodiment, a focal position detection system of an oblique incidence method (not shown) for measuring the position in the Z direction on the surface of the wafer W is provided. However, alternately a plurality of gap sensors may be provided on the core plate 79 side, for measuring the space with the wafer table 5.

[Seventh Embodiment]

Next is a description of a seventh embodiment of the present invention with reference to FIG. 23 to FIG. 26. This embodiment uses a drive unit different from that of the first embodiment. Similar parts corresponding to those in FIG. 1 and FIG. 2 are denoted by the same reference numerals in FIG. 23 to FIG. 26, and detailed description thereof is omitted.

Figure 23:
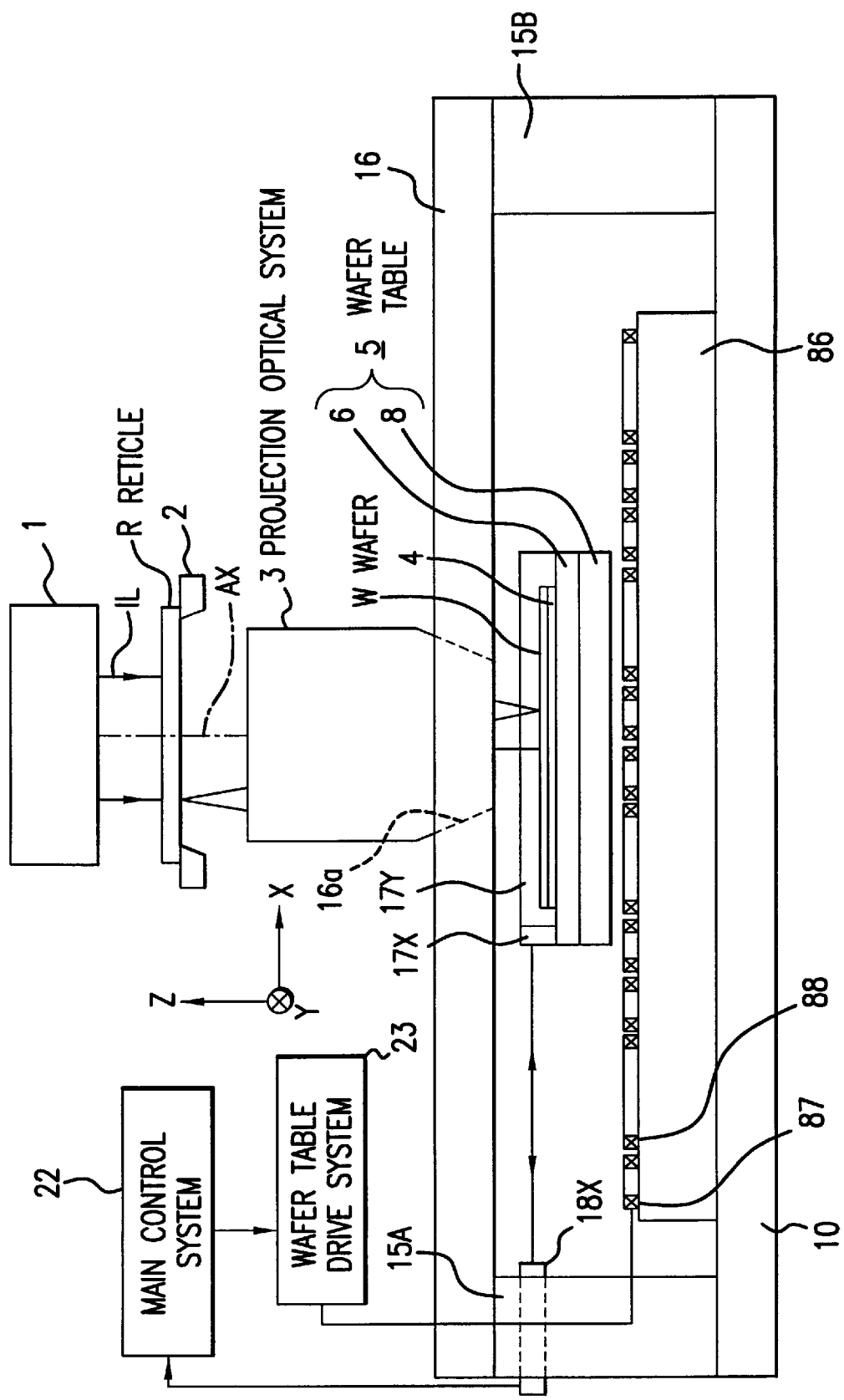
FIG. 23 is a sectional view showing a projection exposure apparatus of an other embodiment of the present invention.

FIG. 23 is a schematic structural diagram showing a projection exposure apparatus of this embodiment. At a bottom face side of a wafer table 5, a base 86 comprising a rectangular iron board as a material having high magnetic permeability is arranged so as to cover the moving range of the wafer table 5, the base 86 being installed on a bottom yoke 10 comprising a material having high magnetic permeability. Moreover, the base 86 may be a non-magnetic material. Multiple drive coils 87, 88 serving as the drive units are installed on the base 86 in a predetermined array so as to face the plane in which the magnet plate 8 of the wafer table 5 moves. When the drive coils 87 and 88 are fully contained at the bottom face of the magnet plate 8, the drive coils 87, 88 operate as lifting drive coils which generate a thrust in the −Z direction (attraction) or a thrust in the +Z direction (repulsion) with respect to the magnet plate 8 (wafer table 5). With this embodiment, there are always at least three lifting drive coils, and the position in the Z direction, the angle of inclination around the X axis and the angle of inclination around the Y axis of the wafer table 5 can be controlled by these drive coils. Hence the lifting drive coils are also referred to as a "Z leveling coils".

On the other hand, when the drive coils 87, 88 are arranged so as to cross the edge of the magnet plate 8, the drive coils 87, 88 operate as lateral shift drive coils which generate a thrust in the ±X direction or in the ±Y direction with respect to the magnet plate 8 (wafer table 5). The lateral shift drive coils are also referred to as "horizontal coils". The drive circuits for these drive coils 87, 88 are incorporated in the wafer table drive system 23.

The bottom yoke 10, the base 86, the magnet plate 8, the top yoke 16 and the supports 15A, 15B form a closed magnetic circuit. However if the base 86 is a non-magnetic material, the base 86 has no affect on the magnetic circuit. Therefore, even in a state with the drive coils 87 and 88 not being operated, the lifting force acts on the magnet plate 8 (wafer table 5) in the direction of attraction to the top yoke 16 side between the bottom yoke 10 and the top yoke 16. By actually generating a thrust attracting the magnet plate 8 toward the bottom yoke 10 side in the drive coils 87, 88 (lifting drive coils), the magnet plate 8 (wafer table 5) is stably supported in a floating state at a desired position in the Z direction.

Moreover, in this embodiment, the main control system 22 performs positioning of the wafer table 5 (wafer W) by controlling the thrust by means of multiple drive coils 87, 88 arranged at the bottom face of the wafer table 5 via the wafer table drive system 23, based on measurements of the X-coordinate and Y-coordinate and the rotation angle of the wafer table 5 (wafer W) by means of laser interferometers 18X, 18Y1, 18Y2, and respectively corresponding movable mirrors 17X and 17Y.

As described above, to the magnet plate 8 of the wafer table 5 in this embodiment, the thrust in the X direction, the Y direction and the Z direction is imparted by means of the multiple drive coils 87, 88 at the bottom face thereof. Below is a detailed description of the construction and operation of the drive coils 87 and 88.

Figure 24:
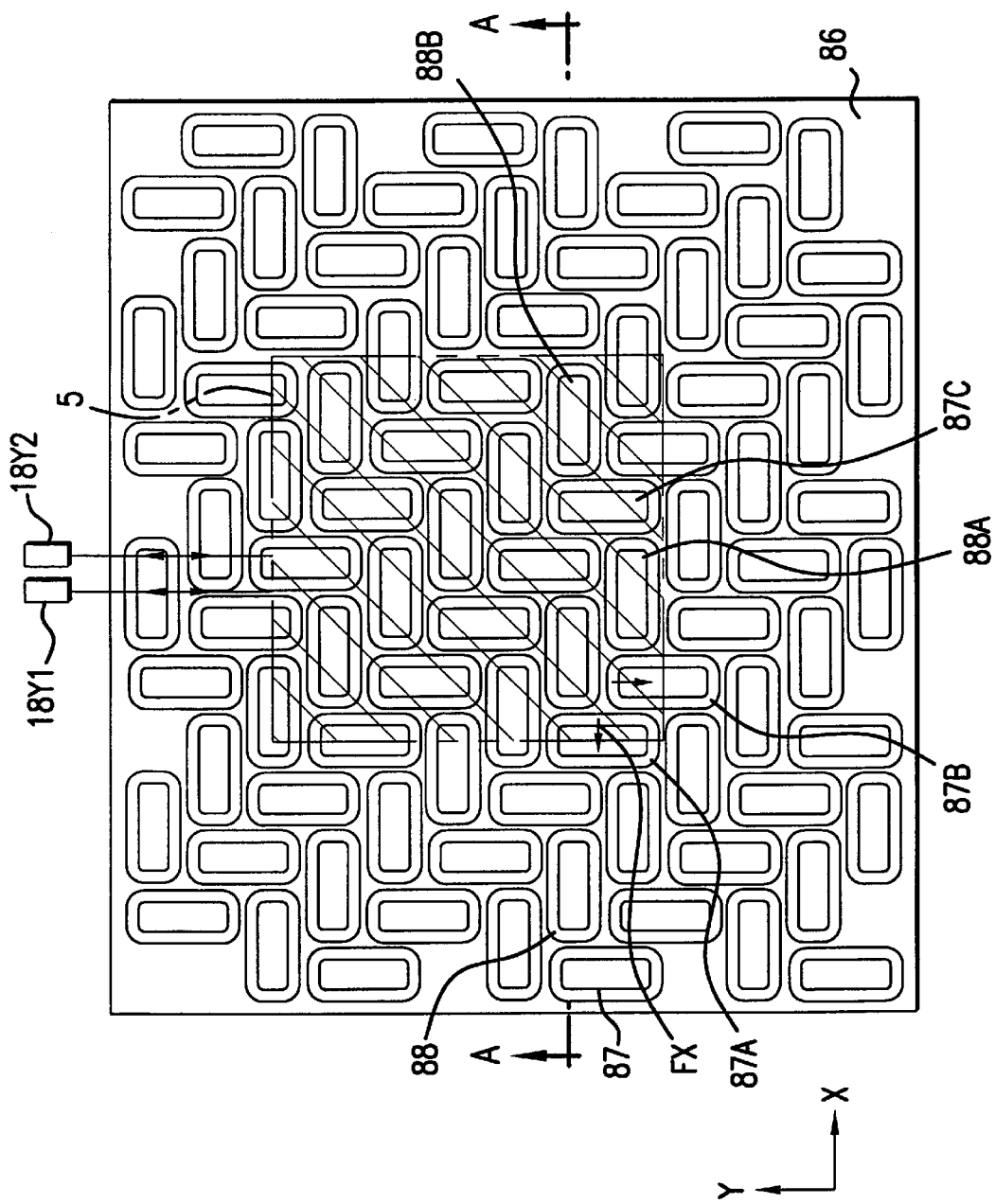
FIG. 24 is a plan view showing an arrangement plane of the drive coils 87, 88 in FIG. 23.

FIG. 24 is a plan view showing the plane where the drive coils 87, 88 are arranged. The drive coils 87, 88 in FIG. 23 are shown in a sectional view along the line AA in FIG. 24. Moreover, in FIG. 24, the wafer table 5 is represented as a rectangular region with oblique lines.

As shown in FIG. 24, drive coil 87 and drive coil 88 are arranged according to a predetermined rule within the base 86 so as to cover the whole region where the wafer table 5 (wafer W) moves. One drive coil 87 has a coil wound in a rectangular shape elongate in the Y direction, and the other drive coil 88 is obtained by turning the drive coil 87 through 90°, that is, it has a coil wound in a rectangular shape elongate in the X direction. Moreover, the coils may be wound in an elliptic shape instead of the rectangular shape. In this case, the drive coils 87 or 88 are always collectively arranged in at least 5 rows×5 columns at the bottom face of the wafer table 5 (magnet plate 8). Furthermore, the array of the drive coils 87, 88 is determined so that no matter what position the wafer table 5 is in, any two or more of the drive coils 87, 88 exist so as to cross the X direction edge portion and the Y direction edge portion of the wafer table 5.

With the state of FIG. 24, for example a drive coil 87C the same as the drive coil 87 and drive coils 88A, 88B the same as the drive coil 88 are completely contained within the bottom face of the wafer table 5, and drive coils 87A, 87B the same as the drive coil 87 are in positions respectively crossing the X direction edge portion and the Y direction edge portion of the wafer table 5. Therefore, the drive coils 87C, 88A and 88B operate as the lifting drive coils, and the drive coils 87A and 87B operate as the lateral shift drive coils.

Figure 25:
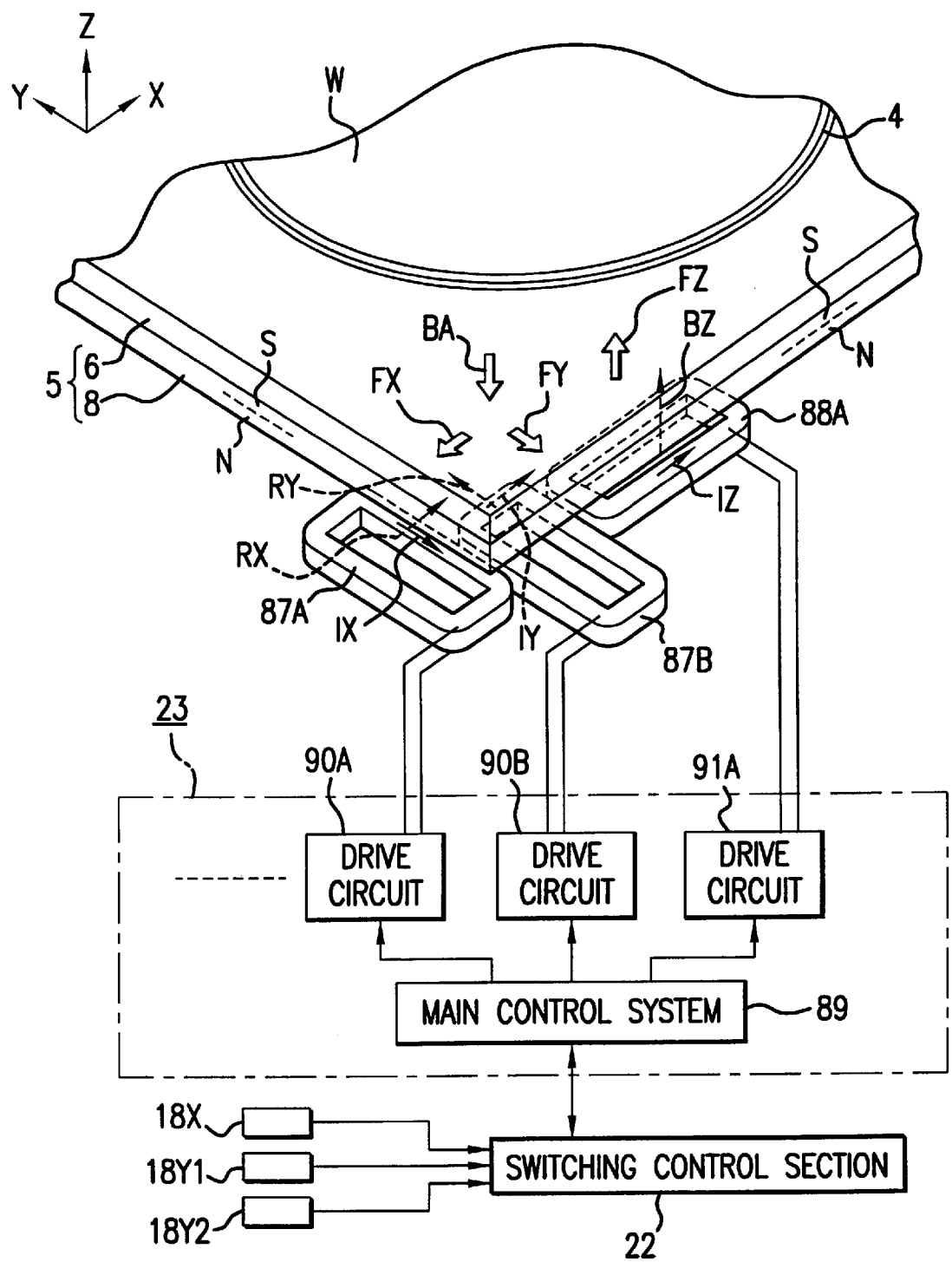
FIG. 25 is a diagram used for the explanation of a drive circuit for the drive coils 87A, 87B, 88A in FIG. 24, and the operation of these drive coils.

FIG. 25 is an enlarged view showing a portion of the drive coils 87A, 87B and the like in FIG. 24. In FIG. 25, a current is respectively supplied to the drive coils 88A located within the bottom face of the wafer table and the drive coils 87A and 87B crossing the edge portion of the wafer table 5, from the drive circuits 91A, 90A and 90B in the wafer table drive system 23. A current is also respectively supplied to other drive coils 87, 88 from the corresponding drive circuits. The switching control section 89 in the wafer table drive system 23 supplies information about the thrust in the X direction, the Y direction and the Z direction instructed from the main control system 22 to each drive circuit 90A, 90B, and the like.

With this embodiment, the magnetic flux BA going, for example in the −Z direction from the magnet plate 8 to the drive coil 87A is generated by means of the magnet plate 8 in the wafer table 5, and the bottom yoke 10, the top yoke 16 and the like in FIG. 24. The main control system 22 discriminates the drive coil 88A completely contained within the bottom face of the wafer table 5 from the drive coils 87A and 87B lying in the position crossing the edges of the wafer table 5, from the measurements of the laser interferometers 18X, 18Y1 and 18Y2, and instructs the switching control section 89 to generate a thrust in the Z direction with respect to the magnet plate 8 (wafer table 5) to the drive coil 88A, and to generate a thrust in the X direction and in the Y direction to the drive coils 87A and 87B, respectively.

In accordance with this, the drive circuit 90A supplies the current IX flowing in the Y direction at the bottom face of the wafer table 5 to the corresponding drive coil 87A, the drive circuit 90B supplies the current IY flowing in the X direction at the bottom face of the wafer table 5 to the drive coil 87B, and the drive circuit 91A supplies the current IZ to the drive coil 88A. As a result, a Lorentz force RX is generated in the X direction in the drive coil 87A by means of the current IX flowing in the drive coil 87A and the magnetic flux BA in the Z direction, and a thrust FX in the X direction as the reaction force to the Lorentz force is generated in the magnet plate 8 (wafer table 5).

Similarly, by means of the current IY flowing in the drive coil 87B and the magnetic flux BA in the Z direction, a Lorentz force RY is generated in the Y direction in the drive coil 87B, and a thrust FY in the Y direction as the reaction force to the Lorentz force is generated in the magnet plate 8 (wafer table 5). In this case, the thrusts FX, FY are respectively proportional to the currents IX, IY. Hence the drive circuits 90A and 90B respectively set the currents IX, IY according to the thrust instructed from the switching control section 89. The direction of these thrusts FX, FY can be optionally set to either direction according to the direction (sign) of the respective corresponding currents IX, IY.

Furthermore, by controlling the current value supplied to the drive coil 88A from the drive circuit 91A, a new variable magnetic flux BZ passing through the drive coil 88A is generated, and by means of this variable magnetic flux, a thrust FZ in the Z direction comprising a reluctance force acts on the magnet plate 8. The thrust FZ can also be set to either the +Z direction (repulsion) or the −Z direction (attraction) according to the direction (sign) of the current IZ supplied to the drive coil 88A. With this embodiment, the lifting force is imparted to the magnet plate 8 (wafer table 5) by means of the magnetic flux BA, to support the deadweight of the wafer table 5. Then, by combining the thrust FX, FY and FZ in the X direction, the Y direction and the Z direction on the magnet plate 8 (wafer table 5), generated from the multiple drive coils 87, 88, the wafer table 5 can be positioned with six degrees of freedom (displacement in the X direction, Y direction and Z direction, and rotation around the X axis, Y axis and Z axis).

Figure 26A:
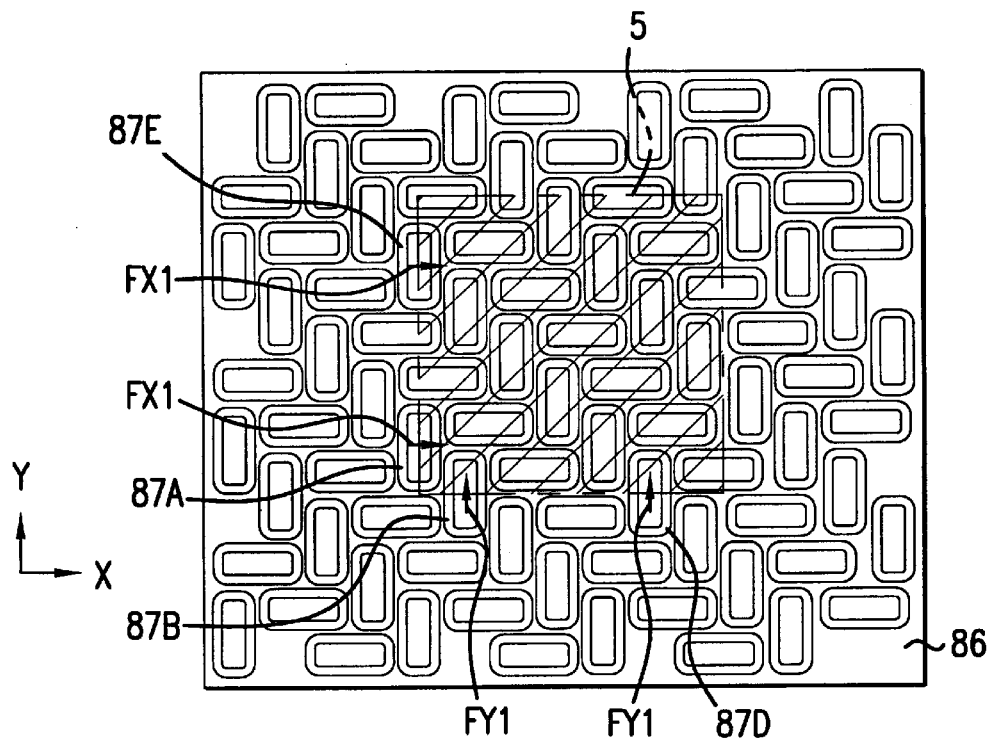
FIG. 26(a) is a plan view for the case of driving a wafer table 5 in the X direction and the Y direction using a plurality of drive coils 87, 88 in FIG. 24

Specifically, when the wafer table 5 (wafer W) is to be displaced in the X direction, as shown in FIG. 26(a) the main control system 22 gives an instruction to generate thrusts FX1 in the X direction to the drive coils 87A, 87E crossing the X direction edge of the wafer table 5. According to this, the thrusts FX1 in the X direction act on the wafer table 5 from the drive coils 87A and 87E, respectively, to thereby displace the wafer table 5 in the X direction. Similarly, when the wafer table 5 is to be displaced in the Y direction, the thrusts FY1 in the Y direction can be made to act on the wafer table 5 from the drive coils 87B, 87D crossing the Y direction edge of the wafer table 5.

Figure 26B:
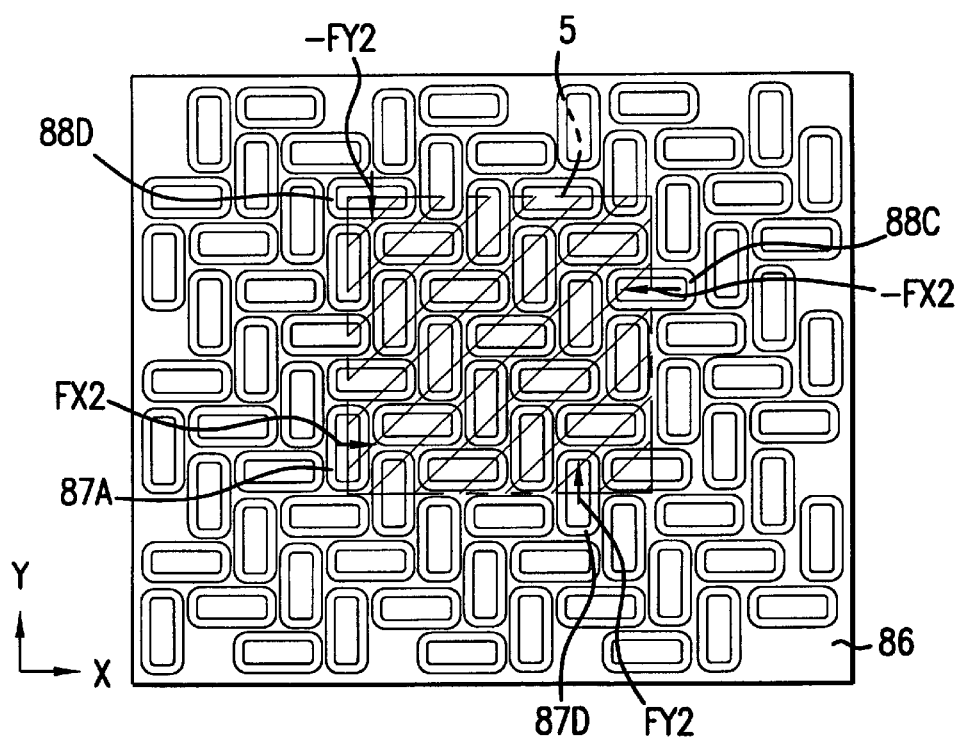
FIG. 26(b) is a plan view for the case of rotation thereof.

When a rotation error θ occurs in the wafer table 5 (wafer W), as shown in FIG. 26(b), the thrust FX2 in the +X direction and the thrust −FX2 in the −X direction are generated respectively from a pair of drive coils 87A and 88C crossing the +X direction edges of the wafer table 5 and separated in the Y direction, and the thrust FY2 in the +Y direction and the thrust −FY2 in the −Y direction are generated respectively from a pair of drive coils 87D and 88D crossing the +Y direction edges of the wafer table 5 and separated in the X direction, to thereby rotate the wafer table 5 so as to offset the rotation error θ. At this time, since the rotation angle of the wafer table 5 is monitored from the measurements of the laser interferometers 18Y1 and 18Y2 in FIG. 24, the rotation angle of the wafer table 5 can be accurately corrected with a closed loop based on the measurements.

As described above, with this embodiment, since the wafer table 5 on which the wafer W is mounted is driven in a non-contact state, the wafer W can be positioned at a high speed.

Furthermore, with the above described seventh embodiment, a coil wound in a rectangular shape is used as the drive coils 87 and 88. However for example, a coil wound in a square shape or circular shape may be used.

Moreover, with the above described seventh embodiment, a focal position detection system of an oblique incidence method (not shown) for measuring the position in the Z direction on the surface of the wafer W is provided.

However, alternatively a plurality of gap sensors may be provided on the base 86 side, for measuring the space with the wafer table 5.

Furthermore, the present invention is not limited to the first to the seventh embodiments, and may have various constructions without departing from the gist of the present invention. Moreover, the above described respective embodiments are ones in which the present invention is applied to a batch exposure type projection exposure apparatus. However, the present invention may be applied to a scanning exposure type projection exposure apparatus such as a step and scan method which performs transfer by synchronously scanning the reticle and the wafer with respect to the projection optical system.

INDUSTRIAL APPLICABILITY

The present invention relates to a positioning apparatus for positioning without contact a movable body on which an object to be positioned, for example, a semiconductor wafer or the like is mounted, a drive unit, and an exposure apparatus incorporating this positioning apparatus. With this positioning apparatus, a movable table comprising a movable body and a magnetism generation body can be made thin and lightweight. Moreover, according to the (first) positioning apparatus of the present invention, for example most of the deadweight of the movable table is supported by the magnetic circuit comprising a magnetic member and the magnetism generation body, and the force for lifting of the magnetism generation body is controlled by a lifting coil. Therefore, there is the advantage that the movable body, on which an object to be positioned, such as a wafer, is mounted, can be stably supported in a non-contact state, and that the movable body can be accurately positioned in the height direction with a strong thrust. Moreover, since a strong thrust in the height direction can be obtained, a gap between the movable table and the drive unit can be made large, so that there is also the advantage that, for example, a cooling mechanism or the like can be easily arranged in the space of this gap.

Similarly, according to the other (second or third) positioning apparatus of the present invention, most of the deadweight of the movable table including the movable body and the magnetism generation body is supported by the magnetic circuit, and a two-dimensional thrust is generated in the magnetism generation body in the moving plane of the movable body by the thrust generation coil (or drive unit). Therefore, there is the advantage that the movable body on which an object to be positioned, such as a wafer, is mounted, can be stably supported in a non-contact state, and that the movable body can be accurately positioned two-dimensionally with a strong thrust. Moreover, since for example a plurality of drive units need only be arranged so as to cover approximately the whole face of the moving plane of the movable body (magnetism generation body), the drive mechanism does not become large compared to the moving stroke of the movable body, and the movable body can be positioned in a non-contact state. Moreover, when a position measuring system for measuring the position of the movable body in the moving plane is provided, the positioning precision increases, and when a deformation quantity measuring system for measuring the deformation quantity of the magnetism generation body is provided, the deformation of the magnetism generation body due to the magnetism can be actively corrected. Furthermore, when a magnetostriction member which deforms so as to independently offset the deformation due to the magnetism of this magnetism generation body is adhered thereto, the flatness of the magnetism generation body can be maintained with high precision.

Next, according to the other (fourth) positioning apparatus of the present invention, there is the advantage that the movable body on which an object to be positioned is mounted can be stably supported in a non-contact state, and that the movable body can be accurately positioned with a strong thrust, similarly as with the above described (first or second) positioning apparatus. Moreover, by mounting the object to be positioned, for example between two magnetism generation bodies, the magnetic flux barely acts on the object to be positioned. Hence there is an advantage in that the positioning apparatus can also be applied for example as a positioning apparatus for a charged particle beam transfer apparatus.

Furthermore, when the positioning apparatus has a construction for dispersing to the floor the reaction force due to the thrust generated at the time of positioning of the movable body, the occurrence of vibration can be suppressed. Moreover, when the magnetism generation body is monopolar, the construction is made simple. Furthermore, since the quantity of heat generation in the lifting coils is small, the positioning precision increases. Moreover, when the magnetic member has the first to third magnetic members, the assembly and adjustment of the magnetic members becomes easy. Furthermore, when the movable body and the magnetism generation body are in a flat shape, the movable table can be made thin and lightweight. Moreover, when an auxiliary magnetic member comprising a material with high magnetic permeability is arranged on at least one of the upper face and the bottom face of the magnetism generation body, the force for lifting by means of the magnetic circuit increases. Hence the quantity of heat generation of the lifting coils can be further reduced. Furthermore, when the magnetic core of a plurality of coils forms a part of the magnetic member, lifting coils and coils for generating thrust can be made in a unit, and the construction thereof is made simple. Moreover, when a cooling apparatus for cooling the drive unit is arranged in the vicinity of the drive unit, the influence of the heat generation of the coils can be further reduced.

Next, according to the other (fifth) positioning apparatus of the present invention, there is the advantage that as with the above described (first or second) positioning apparatus, the movable body on which an object to be positioned is mounted, can be stably supported in a non-contact state, and that the movable body can be easily positioned in a non-contact state.

Moreover, when the construction is such that a first coil wound in a rectangular or elliptic shape and a second coil obtained by turning the first coil through a predetermined angle are arranged two-dimensionally, by only arranging one kind of coil in combination, these can be easily arranged so that there is always a drive coil crossing the two direction edges of the magnetism generation body.

As described above, according to the positioning apparatus of the present invention, it is possible to position a movable body at high speed and with high precision, and the apparatus is suitable for use in an exposure apparatus, a test apparatus, a measuring apparatus or the like which requires positioning of a substrate, for example a wafer or the like, at high speed and with high precision.

Furthermore, according to the exposure apparatus of the present invention, since the substrate is positioned at high speed by means of the positioning apparatus of the present invention, there is the advantage that a semiconductor device or the like can be produced with high throughput and with high precision.

The drive unit of the present invention is useful as a drive unit of, for example the (third) positioning apparatus of the present invention, and is suitable for being used for positioning a movable body at high speed and with high precision.

What is claimed is:

1. A stage apparatus that drives a movable body on which an object is mounted, comprising:
    a magnetism generation body incorporated in said movable body, the magnetism generation body being monopolar;
    a magnetic member provided opposite to said magnetism generation body; and
    a drive unit provided between said magnetism generation body and said magnetic member, the drive unit comprising a coil member cooperating with the magnetism generation body so as to drive the movable body in a first direction and a second direction different from the first direction by a Lorentz force.

2. A stage apparatus of claim 1, wherein said magnetism generation body generates a magnetic flux directed toward a direction perpendicular to a moving plane along which said movable body moves,
    said magnetic member forms a magnetic circuit together with said magnetism generation body, and
    said coil member of said drive unit includes a lifting coil wound so as to generate a variable thrust due to reluctance with respect to said magnetism generation body in a direction perpendicular to said moving plane.

3. A stage apparatus of claim 1, wherein said magnetism generation body generates a magnetic flux directed toward a direction perpendicular to a moving plane along which said movable body moves,
    said magnetic member forms a magnetic circuit together with said magnetism generation body, and
    said drive unit comprises: a core member that passes said magnetic flux within said magnetic circuit; a first thrust generation coil wound around said core member so as to generate a thrust as a Lorentz force with respect to said magnetism generation body in a first direction within said moving plane; and a second thrust generation coil wound around said core member so as to generate a thrust as a Lorentz force with respect to said magnetism generation body in a second direction intersecting said first direction.

4. A stage apparatus of claim 1, wherein said magnetism generation body generates a magnetic flux directed toward a direction perpendicular to a moving plane along which said movable body moves,
    said magnetic member forms a magnetic circuit together with said magnetism generation body, and
    said drive unit comprises: a core member which passes the magnetic flux within said magnetic circuit; a thrust generation coil wound around said core member so as to generate a thrust as a Lorentz force with respect to said magnetism generation body in a direction along said moving plane; and a lifting coil wound around said core member so as to generate a variable thrust due to reluctance with respect to said magnetism generation body in a direction perpendicular to said moving plane.

5. A stage apparatus of claim 4, wherein said core member is an arch-like member with a convex part facing said magnetism generation body, and two end portions of said arch-like member are magnetically coupled to said magnetic member, said thrust generation coil is wound around a middle portion of said arch-like member, and an area of a surface of the thrust generation coil facing said magnetism generation body is substantially larger than an area of said core member facing said magnetism generation body, and an area of a surface of said thrust generation coil facing away from said magnetism generation body, and said lifting coils are wound on said two end portions of said arch-like member.

6. A stage apparatus of claim 1, further comprising a position measurement system that measures a position of said movable body in said moving plane.

7. A stage apparatus of claim 1, further comprising a deformation measurement system for measuring a deformation of said magnetism generation body.

8. A stage apparatus of claim 1, wherein said drive unit drives said movable body in a two-dimensional direction.

9. A stage apparatus of claim 1, further comprising a construction that disperses to a floor a reaction force due to thrust generated at the time of driving said movable body.

10. A stage apparatus of claim 1, wherein said movable body and said magnetism generation body are a flat shape.

11. A stage apparatus of claim 1, wherein an auxiliary magnetic member formed of a high magnetic permeability material is disposed on at least one of an upper face and a bottom face of said magnetism generation body.

12. A stage apparatus of claim 1, wherein a cooling apparatus that cools said drive unit is provided in the vicinity of said drive unit.

13. A stage apparatus of claim 1, wherein said drive unit has a plurality of drive coils arranged at a bottom face side of said magnetism generation body such that there is always a drive coil crossing an edge portion of said magnetism generation body, and
    said stage apparatus further comprises: a position detection apparatus for detecting a position of said movable body in a moving plane along which said movable body moves; and a control system that discriminates from amongst said drive coils, corresponding to the detection results of said position detection apparatus, a lifting drive coil which fully faces the bottom face of said magnetism generation body, and a lateral shift drive coil located in a position facing an edge of said magnetism generation body; and
    said movable body is driven by a thrust generated in said magnetism generation body by said lateral shift drive coil, in a condition where said movable body is supported in a non-contact state by said lifting drive coil.

14. A stage apparatus of claim 13, wherein said plurality of drive coils comprise first coils wound in a rectangular or elliptic shape, and second coils provided by turning said first coils through a predetermined angle, and said first coils and said second coils are arranged two-dimensionally.

15. An exposure apparatus comprising the stage apparatus of claim 1, and said exposure apparatus exposes a mask pattern onto a substrate driven by said stage apparatus.

16. A stage apparatus of claim 1, wherein said drive unit comprises at least a coil.

17. A stage apparatus of claim 16, wherein said coil has a flat shape.

18. A stage apparatus of claim 1, wherein the magnetism generation body comprises a pair of magnet members connected to side surfaces of the magnetism generation body respectively.

19. A stage apparatus of claim 1, wherein the coil member comprises a first coil member to drive the movable body in the first direction and a second coil member to drive the movable body in the second direction.

20. A stage apparatus of claim 19, wherein the drive unit comprises a core member, the first coil member and the second coil member being wound on the core member.

21. A drive unit arranged in a magnetic circuit formed by a magnetism generation body and a magnetic member so as to generate a Lorentz force, the drive unit comprising:
   a core member that passes a magnetic flux in a first direction within said magnetic circuit and is magnetically coupled with said magnetic member; and
   a second direction coil wound around said core member in a second direction perpendicular to said first direction; and
   wherein said second direction coil is wound so that an area of a surface thereof facing said magnetism generation body is larger than an area of a surface thereof opposite to a magnetism generation body side.

22. A drive unit of claim 21, wherein said core member is an arch-like member with a convex part facing said magnetism generation body, and two end portions of the arch-like member are magnetically coupled to said magnetic member, and said second direction coil is wound around a middle of said arch-like member.

23. A drive unit of claim 21, wherein said core member is a rectangular member having a plurality of planes crossing each other, and said second direction coil is wound around said crossing planes.

24. A drive unit of claim 21, wherein said core member comprises a first direction coil wound in said first direction.

25. A drive unit of claim 24, wherein said first direction coil is arranged in a condition wound around a plurality of said core members.

26. A positioning apparatus comprising said drive units of claim 21 and a movable body on which an object is mounted and in which said magnetism generation body is provided, wherein said positioning apparatus performs positioning of said movable body by means of said drive unit and said magnetic member.

27. An exposure apparatus comprising the positioning apparatus of claim 26, wherein said exposure apparatus exposes a mask pattern onto a substrate positioned by said positioning apparatus.

28. A drive method for driving a movable body on which an object is mounted, comprising the steps of:
   assembling a magnetism generation body in said movable body, the magnetism generation body being monopolar;
   disposing a magnetic member so as to face said magnetism generation body;
   disposing a drive unit between said magnetism generation body and said magnetic member, the drive unit comprising a coil member cooperating with the magnetism generation body; and
   driving said movable body in a first direction and a second direction different from the first direction by a Lorentz force generated by said drive unit.

29. A drive method of claim 28, wherein said movable body is driven in a two-dimensional direction in said step of driving.

30. A drive method of claim 28, further comprising a step of measuring a position of said movable body.

31. A drive method of claim 28, further comprising a step of measuring a deformation of said magnetism generation body.

32. A stage apparatus that drives a movable body having a holding surface to hold an object, the stage apparatus comprising:
   a magnet member connected to the movable body; and
   a driver cooperating with the magnet member to drive the movable body, the driver having a core member and a coil member, the coil member including a first coil member to drive the movable body in a first direction, a second coil member to drive the movable body in a second direction different from the first direction, and a third coil member different from the first coil member and different from the second coil member.

33. A stage apparatus of claim 32, wherein the magnet member is monopolar.

34. A stage apparatus of claim 32, wherein at least the first coil member and the second coil member are wound on the core member.

35. A stage apparatus of claim 32, wherein the third coil member drives the movable body in a third direction that is different from the first and second directions.

36. A stage apparatus of claim 32, wherein the third coil member drives the movable body in a third direction that is perpendicular to the holding surface.

* * * * *